United States Patent [19]
Fonash et al.

[11] Patent Number: 5,994,911
[45] Date of Patent: Nov. 30, 1999

[54] METHOD AND APPARATUS TESTING IC CHIPS FOR DAMAGE DURING FABRICATION

[75] Inventors: Stephen J. Fonash; Osama O. Awadelkarim; Murat Okandan, all of State College, Pa.; Maria M. Ozaita-Mintegui, Bilbao, Spain

[73] Assignee: The Penn State Research Foundation, University Park, Pa.

[21] Appl. No.: 08/842,345

[22] Filed: Apr. 24, 1997

Related U.S. Application Data

[60] Provisional application No. 60/017,361, Apr. 26, 1996.

[51] Int. Cl.$^6$ ................................................. G01R 31/28
[52] U.S. Cl. .......................................... 324/759; 324/750
[58] Field of Search .................................... 324/765, 769, 324/750, 751, 752, 759, 158.1, 73.1, 763; 371/22.1, 22.3, 22.6; 438/14, 17; 714/733, 33

[56] References Cited

U.S. PATENT DOCUMENTS

| | | | |
|---|---|---|---|
| 3,636,450 | 1/1972 | Griffin | 324/769 |
| 5,053,699 | 10/1991 | Aton | 324/73.1 |
| 5,659,244 | 8/1997 | Sakaguchi | 324/752 |
| 5,804,980 | 9/1998 | Nikawa | 324/751 |

OTHER PUBLICATIONS

Uwasawa et al; "Scaling Limitation of Gate Oxide in P+ Polysilicon Gate MOS Structures For Sub Quarter Micron CMOS Device"; 1993 IEEE; pp. 895–898, unavailable month.

*Primary Examiner*—Vinh P. Nguyen
*Attorney, Agent, or Firm*—Thomas J. Monahan

[57] ABSTRACT

An approach using two terminal current measurements, preferably in a cyclic current-voltage sweeping procedure, and specialized test structure, is shown to be very useful in detecting processing induced changes in poly-Si/ultra-thin $SiO_2$/substrate Si structures. The charging current structure discernible in this approach is seen to have different features depending on processing history of the device. This is shown for the specific case of plasma gate definition etching with or without annealing.

20 Claims, 18 Drawing Sheets

METHOD AND APPARATUS TESTING IC CHIPS FOR DAMAGE DURING FABRICATION

This application claims the benefit of U.S. Provisional Application Ser. No. 60/017,361 filed on Apr. 26, 1996.

BACKGROUND OF THE INVENTION

1. Field of the Invention

This invention is directed toward methods and apparatus for monitoring damage on microelectronic devices brought on by processing steps. More particularly, the invention is directed toward the use of a current-voltage, or a cyclic current-voltage measurement system to monitor processing, to quantify damage and to monitor the correction (i.e. annealing) of the damage by means of subsequent processing steps.

2. Background of the Art

Dielectric/semiconductor systems are widely used, and are of great importance, in the microelectronics industries. Such systems include ultrathin layers such as $SiO_2/Si$ materials systems. Such ultrathin $SiO_2/Si$ systems are particularly difficult to monitor and characterize using prior art capacitive-voltage (C-V) monitoring techniques because C-V measurements for such thin $SiO_2$ layers are severely hampered by the presence of high conductance in ultrathin dielectric structures. This results in interpretation of C-V results becoming relatively complex.

Another prior art technique used to study and monitor dielectric/semiconductor interfaces is the deep level transient spectroscopy (DLTS) technique. The DLTS technique can, however, only probe the semiconductor material in the system and, therefore, does not provide any information on the critical $SiO_2/Si$ interface, and the $SiO_2$ itself. In addition, DLTS is relatively slow and requires cooling to cryogenic temperatures.

Attention is now directed to prior art systems or procedures for specifically monitoring damage on microelectronic devices brought on by plasma processing steps. The CHARM technique uses floating gate memory devices (EEPROMs) to monitor the surface potential and the ultraviolet (UV) exposure during processing. CHARM does not provide any information on direct plasma exposure damage, since all devices are encapsulated and they are never exposed directly to the plasma being studied. Furthermore, the CHARM devices are complex and the processing involved in their fabrication is lengthy and therefore costly. SPIDER plasma processing monitoring wafers evaluate the overall impact of processing on individual transistors, and monitor charging damage through the use of antenna structures. SPIDER, like CHARM, requires lengthy, costly processing for its fabrication. In addition, both CHARM and SPIDER use time consuming terminal measurements of devices after exposure to determine the extent of any detrimental processing exposure effects.

In view of the summarized prior procedures above, an object of the present invention is to provide a simple, two-terminal measurement of easily fabricated test structures for monitoring the impact of processing of typical ultrathin and other microelectronic devices, such as ultrathin $SiO_2/Si$ systems. This measurement technique eliminates problems in C-V measurements resulting from the high conductance of the ultrathin $SiO_2$.

Another object of the present invention is to provide a technique for interrogating all of the interface states of an ultrathin device such as a $SiO_2/Si$ device, at the interface.

An additional object of the present invention is to provide a two terminal monitoring systems which yields results which are easily and quickly interpreted.

One benefit of the present invention is to provide a monitoring system which can be operated at room temperature.

Another object of the invention is to provide a system which can fully characterize the dielectric/semiconductor interface, unlike the DLTS which can not access the interface directly but only access the semiconductor portion of the device.

Yet another object of the present invention is to provide a monitoring system which can be used in a contact-free mode, wherein the dielectric/semiconductor interface is characterized by using a contact free probe which is positioned extremely close to the surface of the device, and the probe/air or a probe/insulator region is flux coupled to an ultrathin system such as a $SiO_2/Si$ materials system.

An additional object of the invention is to provide a technique with which the carrier lifetimes in the semiconductor can be determined conveniently from the near surface region as devices are built.

There are other objects and advantages of the present invention which will become apparent in the following disclosure.

SUMMARY OF THE INVENTION

The present invention monitors processing induced changes by using the charging currents that flow with the charge rearrangements that must take place with electric field modifications within thin dielectric/semiconductor structure as the bias voltage is swept. In the preferred embodiment, the sweeps causing these charging currents are done in cyclic fashion, and these cyclic current-voltage (I-V) sweeps are used to monitor damage to microelectronic device brought on by processing steps. Hall cycle sweeps can be used as an alternate to the cyclic sweeps.

Several specific approaches are possible using specialized structures and the cyclic I-V technique. In one approach, the measurement is first made on "fresh" devices, and these devices are again measured after processing such as plasma etching or deposition, annealing, etc. to assess damage. Another approach is to generate different splits at some processing step in the device fabrication, and to compare the measurements of the resulting structures. One simple specialized structure would be polysilicon (gate material) pads on ultrathin $SiO_2$ (gate oxide) and surrounding thicker oxide (field oxide) with different configurations, fabricated on a single crystal silicon wafer.

In the preferred cyclic I-V embodiment of this charging current measurement, the technique begins with a bi-directional voltage sweep (forward and reverse) and corresponding current measurements. The voltage sweep preferably includes incremental changes or steps in voltage. The sweep senses are defined by the sign of the incremental voltage steps in the measurement. In the case of a p-type semiconductor, forward sweep refers to positive voltage step increases on the gates, and reverse sweep refers to negative voltage step increases on the gates as will be illustrated in detail in subsequent sections.

An I-V measurement is performed as follows. A specific initializing point voltage is forced on the sample for a specified initializing time. Then a specified voltage step addition is forced on the gate at a starting potential, and after a specified time delay, the current is measured. After the current measurement is completed, the next voltage step addition is forced and the current measurement step is repeated. Preferably equal incremental voltage increases are applied, and resulting current measurements are made after each voltage incrementation until a final positive gate potential (for the case of p-type semiconductors) is reached. The voltage is held at this completion voltage for a specified dwell time. Then the voltage is then decreased in preferably equal increments, and resulting current measurements are made after each incrementation until a final negative gate potential (for the case of p-type semiconductors) is reached. It should be understood that the negative or "reverse" sweep can also be performed before the positive of "forward" sweep. One set of measurements, therefore, includes the resultant current measurements at corresponding applied voltages. The interpretation of these measurements is performed by monitoring the measurement set for the resulting "charging currents". By performing the preferred cyclic sweeps, these charging currents are easily discriminated because they add algebraically to the total current in the forward sweep, but subtract algebraically in the reverse sweep. These charging currents correspond to the charging and discharging of the defect states that were created (or amplified) by processing during the fabrication of the device. Large charging peaks correspond to an increase in the density of the defects. Shift in the baselines of the charging peaks with respect to voltage indicates the presence of additional oxide charge. An analysis of the measured current and the magnitudes of the observed charging currents enables detecting and quantifying processing induced changes in microelectronic devices. Removal of defect states by steps such as annealing is shown by the disappearance of the defect charging currents.

There are a number of possible device structures to implement the methodology of this disclosure. For example, if plasma-based processing is being monitored, there are several structures that can be used jointly to isolate effects. To be specific, one can use a field structure, where a polysilicon gate terminates on a thick field oxide, thereby protecting an ultrathin gate oxide from plasma exposure. Charging damage, however, will still affect these devices and can be detected by cyclic I-V sweeps. Another example is a gate structure, where a polysilicon gate terminates on an ultrathin gate oxide. When the gate oxide is exposed to the plasma, this structure will experience some or more overall damage (charging plus direct exposure) which can be detected by cyclic I-V testing.

Other possible structures include a comb and a peak structure. The comb structure is a variation of the gate structure. The polysilicon gate terminates on the ultrathin gate oxide and there are numerous "fingers", thereby increasing the exposed perimeter of the structure. By comparing the measurements of this structure with the gate structure (keeping the areas of both structures the same), the "edge damage" can be monitored. The beak structure, which is a variation of the field structure, utilizes numerous field oxide and gate oxide islands underneath the polysilicon gate. By comparing the measurement of this structure with the field structure, the impact of processing at the "bird's beak" area between the gate and the field can be monitored.

BRIEF DESCRIPTION OF THE DRAWINGS

So that the manner in which the above recited features, advantages and objects of the present invention are attained and can be understood in detail, more particular description of the invention, briefly summarized above, may be had by reference to the embodiments thereof which are illustrated in the appended drawings.

It is to be noted, however, that the appended drawings illustrate only typical embodiments of the invention and are therefore not to be considered limiting of its scope, for the invention may admit to other equally effective embodiments.

DETAILED DESCRIPTION OF THE PREFERRED EMBODIMENTS

It has recently been demonstrated that gate-definition reactive ion etching (RIE) of poly-crystalline silicon (poly-Si) gate. 0.5 micrometer ($\mu$m) channel length metal-oxide-semiconductor field effect transistors (MOSFETs) is a specific example of a processing step that can damage a microelectronic device. It has been specifically shown that this processing step can cause plasma exposure edge damage as well as the well-known plasma charging current damage. By use of poly-Si gate metal-oxide semiconductor (MOS) capacitor structures with 7 nanometer (nm) gate oxides, edge damage and plasma charging damage characteristic features can be seen for this case with the relatively simple two-terminal measurement set forth in this disclosure. Cyclic voltage ramping of device current-voltage (I-V) characteristics in pre-Fowler-Nordheim tunneling gives charging current in cyclic sweeps which is a function of the plasma exposure type, and response to Fowler-Nordheim (FN) stress. The $SiO_2$/substrate Si interface defects are measured; later annealing will cure some of or even most of the defects, and the improvement can be measured.

BASIC CONCEPTS OF THE CYCLIC I-V TECHNIQUE

Figure 1A:
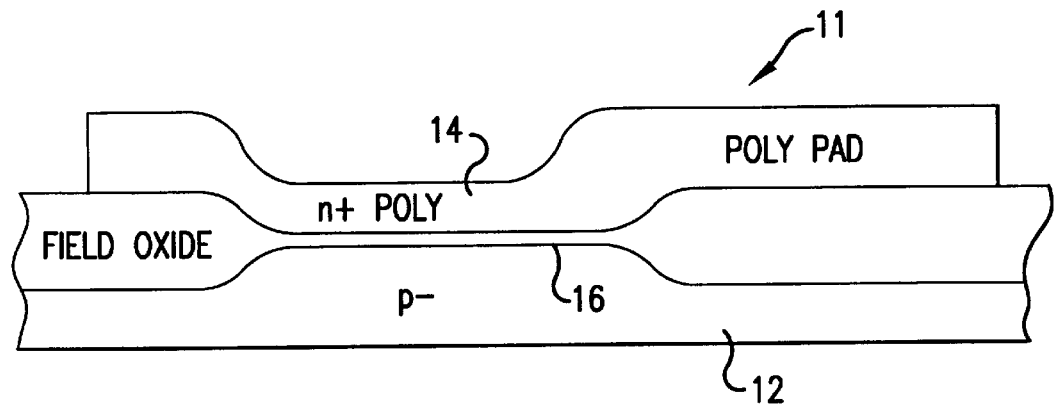
FIG. 1a is a cross sectional view of a field oxide structure.
Figure 1B:
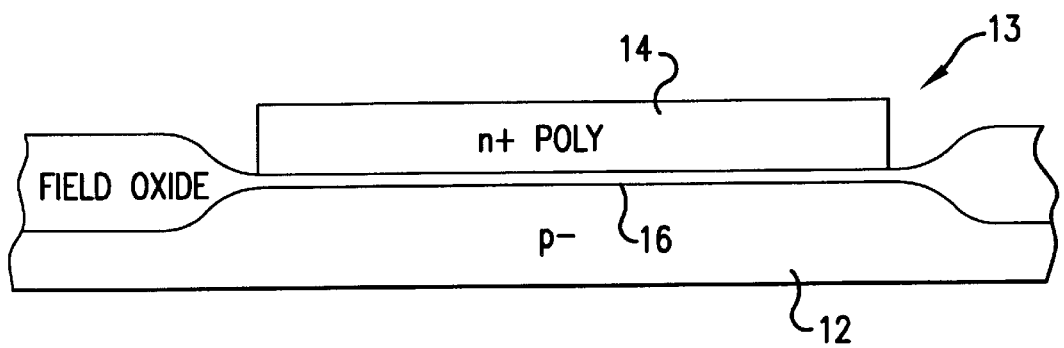
FIG. 1b is a cross sectional view of a gate oxide structure.

In discussing the basic concepts of this disclosure, attention will be directed toward a field oxide device 11 of the type shown in FIG. 1a, and gate oxide device 13 of the type shown in FIG. 1b. It should be noted that other types of structures can be used, as mentioned previously, and the devices 11 and 13 shown in FIGS. 1a and 1b, respectively, are used to present basic concepts. Referring to FIGS. 1a and 1b, both the field oxide and the gate oxide structures comprise a poly-Si layer 14, and the same active poly-Si area ($10^5$ $\mu m^2$) over the 7 nm gate oxide 16. Note that the field oxide device 11 represents the situation in a transistor during gate-definition etching up to the overetch step, since only plasma charging current damage can occur in this structure in FIG. 1a. The gate oxide device 13, however, typifies the situation in a transistor during gate-definition etching including the overetch step; i.e., plasma charging damage has occurred, and then the thin gate oxide 16 at the gate edge is exposed directly to the plasma when the poly-Si 14 clears, as seen in FIG. 1b.

Both device types 11 and 13 were simultaneously fabricated on 8 inch (in.), p-type epitaxial Si wafers 12 on active regions defined using the localized oxidation of silicon (LOCOS) isolation technique. A sacrificial oxide was grown prior to the gate oxidation and removed. The oxidation process for the gate oxide used a temperature ramp from 650 to 900 degrees Centigrade (° C.) in argon (Ar) with a ramp rate of 7° C./minute (min.), a 30 min, stabilization stage in argon and 5 min. of gate oxidation in ambient dry $O_2$. During the oxidation 1% HCl was added to reduce mobile ion contamination. The final process included an anneal step in $N_2$ for 35 min. The gate oxide was determined ellipsometrically to be 7 nm thick and capacitance measurements verified this thickness measurement.

After the gate oxidation, a 220 nm amorphous silicon layer was deposited using low-pressure chemical vapor deposition (LPCVD) at 650° C. The amorphous silicon was later doped with a phosphorus ion implantation step at a dose of $6 \times 10^{15}$ $cm^{-2}$ using an ion energy of 30 kilo electron volts (keV). A rapid thermal annealing process at 1000° C. crystallized this material and activated the dopant. The dopant concentration in the poly-Si gate 14 was high enough ($10^{20}$ $cm^{-3}$) that, in this example, the Fermi-level can be considered fixed with no band bending when a potential is applied. The gate of the devices was defined using photolithography and RIE. This poly gate-definition RIE process used chlorine and HBr. The pressure during the process was 375 milliTorr (mTorr) and the power was 375 Watts (W). Finally, the resist on the poly-Si was removed by ashing in a Gasonics downstream microwave stripper. No metal contacts were deposited and the wafers received no further processing. Hence, the devices did not have any thermal annealing after the RIE except as noted.

Cyclic voltage-sweep I-V measurements

The application of cyclic voltage-sweep I-V measurements to the characterization of this process will be illustrated using the field oxide 11, and gate oxide 13 devices to show charging current features. These measurements are confined to the pre-Fowler-Nordheim regions, because charging currents due to voltage sweeping would be expected to be overwhelmed in the FN tunneling regime of both positive gate and negative gate voltages, in theory and indeed as observed in practice. In these measurements, an instrument, such as a HP4145, is used to obtain the total current (I) flowing at some voltage (V) in the cyclic voltage sweeps but, rather than trying to avoid the previously mentioned charging current during these sweeps, these currents are included in the measurements. Stated another way, these currents are included in the total current measurements and accounted for using data processing techniques detailed in the following paragraphs. In one manifestation of the measurement, this charging current is integrated to give the charge rearrangement Q taking place during the sweep.

Figure 2:
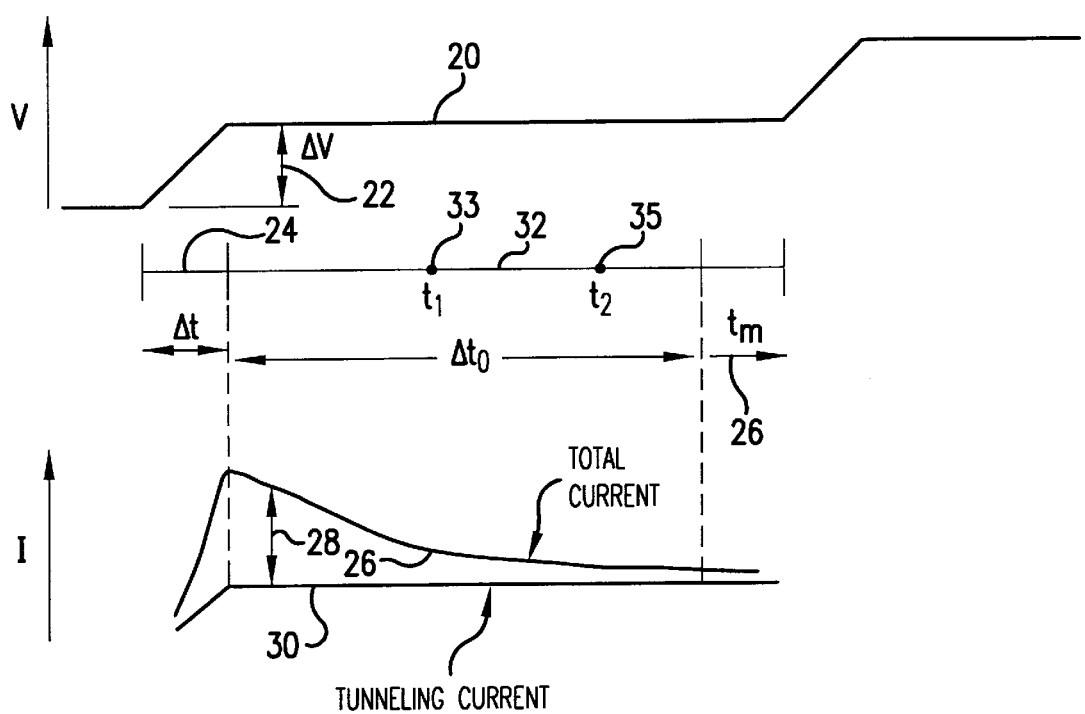
FIG. 2 illustrates a forward step voltage sweep with possible device current response.

Attention is directed to FIG. 2, where curve 20 represents total voltage V (ordinate) applied to the device plotted as a function of time (abscissa). Using the methodology of this invention, the voltage is increased in increments 22 of $\Delta V$ over an incremental period of time $\Delta t$ identified by the numeral 24. Curve 26 represents the total current I measured corresponding in time t to the applied voltage V of curve 20, and is the sum of a tunneling current ($I_{tun}$) component 30 and a charging current component 28. The current I is measured after some adjustable delay time $\Delta t_D$, identified by the numeral 32, after the time interval 24 ($\Delta t$) in which the voltage V is increased by the increment 22 ($\Delta V$) in the voltage sweep. The response in current 26 at V+$\Delta V$ then will eventually relax to the same tunneling (background) current 30 as can be seen in FIG. 2. This is the important information in the measurement technique in that this relaxation is controlled by carriers being trapped and detrapped at or near the $SiO_2$ interface, and in the silicon as well as by minority carrier invasion layer formation and dissipation. This relaxation can be measured in a number of ways. As an example, it can be done by choosing times $t_1$ and $t_2$, identified by the numerals 33 and 35, respectively, and recording $I(t_1)-I(t_2)$, the differences in total measured current at these times. By adjusting $t_1$, the rate window ($t_1-t_2$), and $\Delta t_D$, the maximum in $I(t_1)-I(t_2)$ is obtained thereby giving the relaxation time at V+$\Delta V$ for the responding process. Another way to monitor this relaxation is to integrate the total added current 20 to get the charge rearrangement caused by $\Delta V$. This charge Q can be examined as a function of time (i.e. Q=Q(t)) to extract relaxation processes and times. To summarize, the measured or selected quantities $\Delta t_D$, $t_m$, $t_1$, $t_2$, $\Delta V$, and $\Delta t$ are shown graphically in FIG. 2 and identified by the numerals 32, 26, 33, 35, 22, and 24, respectively. These parameters are used to determine parameters of interest as will be described in subsequent sections of this disclosure.

FIG. 2 illustrates a forward voltage sweep. In a reverse voltage sweep, the voltage is decreased by increments $\Delta V$ over the time interval $\Delta t$ at intervals $\Delta t_D + t_m$. Current measurement procedures are the same for both forward and reverse voltage sweeps.

Typical current measurement (I) versus applied voltage (V) data resulting from the cyclic I-V procedure are shown in FIGS. 3a and 3b, and FIGS. 4a and 4b, for the case of $\Delta t_D$=100 ms. This current I is the sum of the tunneling current $I_{tun}$, crossing the oxide at the given voltage, and any charging current, as shown in FIG. 2 as curves 30 and 28, respectively; present at the measurement time $t_m$, $\Delta t_D$ after the sweep step defined as $\Delta V/\Delta t$. Mathematically, $$I = I_{tun} + C' \Delta V / \Delta t \quad (1)$$

where, C' is an effective capacitance. As seen from FIGS. 3a, 3b, 4a and 4b, and from equation (1), the structures in these cyclic I-V data are charging currents, since they change sense with the sense of the voltage sweep. The C' that can be extracted from these peaks cannot be influenced by accumulation or depletion capacitance since the time $\Delta t_D$ was chosen to be too long; i.e., majority carriers will have responded by this $\Delta t_D$. Hence, C' must be due to minority carrier or trapping-detrapping effects, or to both effects. Any changes in C' due to processing must, therefore, be due to changes in minority carrier generation-recombination lifetimes, in trapping-detrapping, or in both.

Response of I-V Sweep Charging Current

Figure 3A:
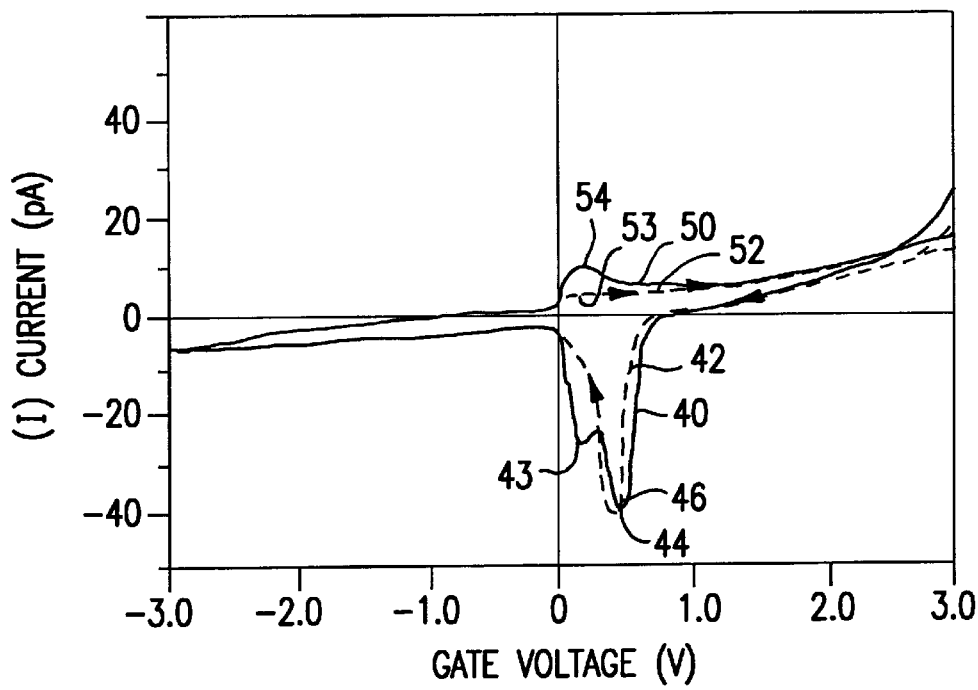
FIG. 3a shows two forward and reverse I-V sweeps for a field oxide devices, without light, where one is for a device from the center and the other from a device from the outer portion of the device wafer.
Figure 4A:
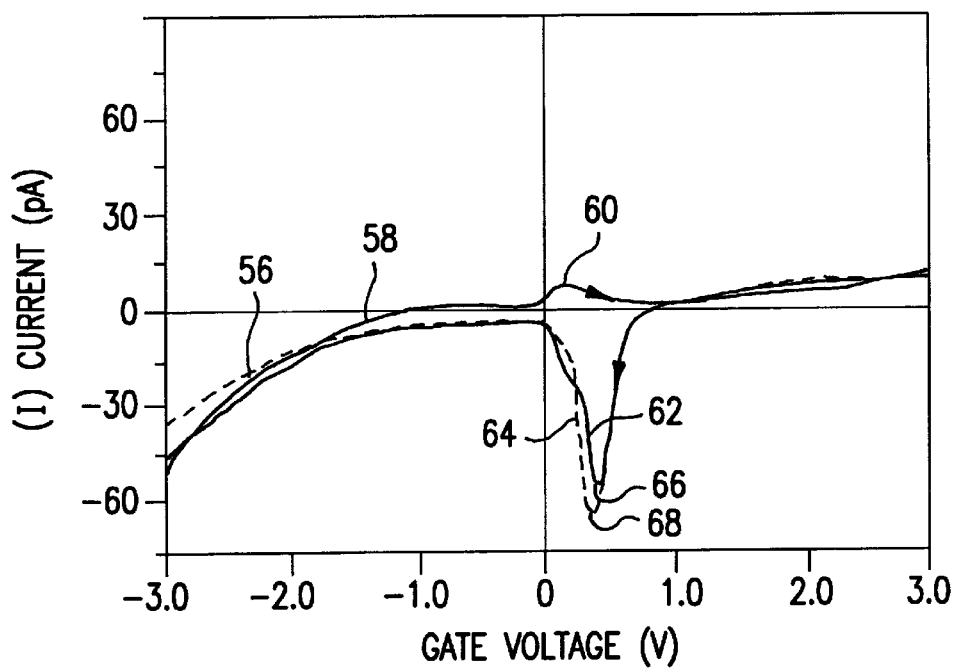
FIG. 4a shows a forward and reverse I-V sweeps for gate oxide devices without light from the center and from the outer portion of the device wafer.

Attention is directed to I-V sweeps shown in FIGS. 3a and 4a, which exhibit current peaks in the pre-Fowler-Nordheim voltage range, that must be charging current components represented mathematically in equation 1, since their algebraic sign depends on the sense of $\Delta V/\Delta t$. Both results from a field oxide device shown in FIG. 3a and a gate oxide device shown in FIG. 4a, show voltage sweeps from −3 to +3 volts.

Referring to FIG. 3a for the field oxide device, curves 50 and 52 represent forward voltage sweeps measured at the center and at a radial position of the device wafer, respectively. Curves 40 and 42 represent reverse sweeps measured at the center and at the same radial position of the device wafer, respectively. Referring to FIG. 4a for the gate oxide device, curves 58 and 56 represent forward voltage sweeps measured at the center and at a radial position of the device wafer, respectively. Curves 62 and 64 represent reverse sweeps measured at the center and at the same radial position of the device wafer, respectively. Both the field and gate oxide devices show forward sweep charging peaks 54, 53 and 60, respectively, for the center and radially displaced measurements, respectively, where the peaks for the center and radial positions overlay at peak 60. Likewise, both the field and gate oxide devices show reverse sweep charging peaks 46, 44 and 66, 68, respectively, tor the center and radially displaced measurements, respectively. The charging peaks are somewhat larger for the gate oxide device, and are seen to decrease with increasing radial position in a wafer, for both the field oxide and gate oxide type devices. In addition, the reverse sweep peak 44 is seen to have a pronounced secondary peak 43 on the low voltage side, a showing that also decreases with wafer radius. This wafer radius dependence follows both the dependence of plasma charging current and blanket plasma exposure damage as seen in RIE tools reported by T. Gu et al, *Vac. Sci. Technol.* A 11, 1323 (1993). As mentioned previously, all peak structure represents the charring current component of equation 1 and represents the quantity of interest in determining device damage.

Figure 3B:
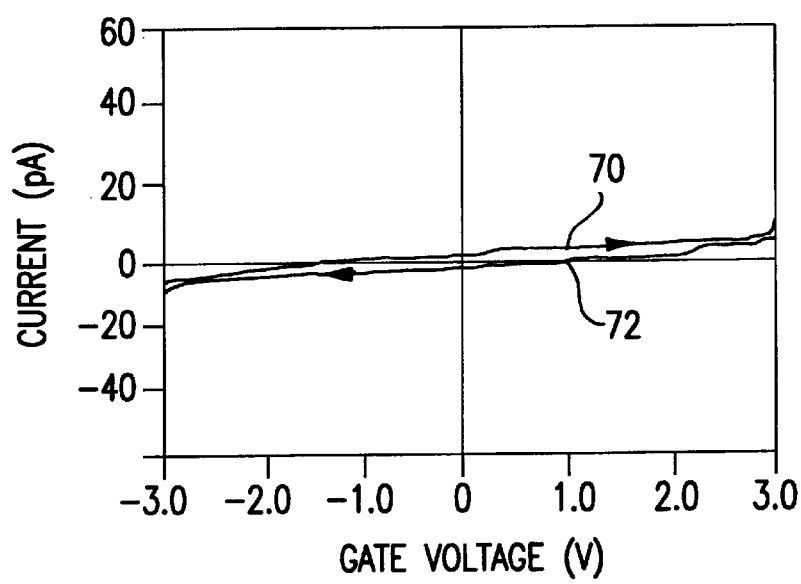
FIG. 3b shows forward and reverse I-V sweeps for field oxide devices under white light from the center and from the outer portion of the device wafer.
Figure 4B:
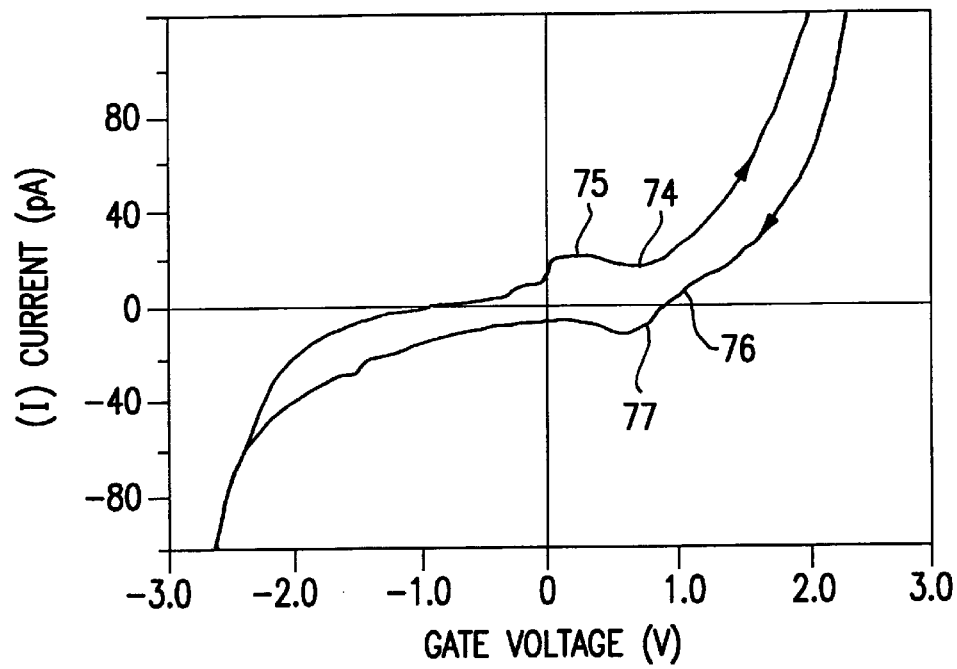
FIG. 4b shows a forward and reverse I-V sweep for gate oxide devices under white light from the center and from the outer portion of the device wafer.

Attention is next directed to FIGS. 3b and 4b which illustrate I-V sweeps of field and gate devices, respectively, under white light illumination. More specifically curves 70 and 72 represent forward and reverse sweeps, respectively, for the field device, and curves 74 and 76 represent forward and reverse sweeps for the gate device, respectively. It can be seen in FIG. 3b that there is no peak structure indicating that charging currents are not present under white light illumination. The peaks 75 and 77 for the forward and reverse sweeps, respectively, indicate that, when compared to results in FIG. 4a, charging currents are strongly modified by white light illumination. At least the red portions of this light are able to penetrate the 220 nm heavily doped poly-Si device gate to the Si substrate; hence these results establish that the carriers giving rise to the charging currents are communicating with the substrate Si for the data shown.

It is noted that a low voltage peak in the pre-Fowler-Nordheim region, similar to those seen in FIGS. 3a and 4a, have been previously reported for the forward sweep in MOS structures by K. I. Uwasawa et al, *Proceedings of IEEE international Electronic Device Meeting* (IEEE Washington, D.C., 1993). pp 895–898. This work, however, used only sweeps in the one (forward) direction and termed this peak an "anomalous leakage" current. That study speculated that this anomalous peak was caused by trapping sites in the gate oxide due to boron penetration from the gate polycrystalline Si. It should be noted that the poly-Si gate used in this disclosure was phosphorous doped, and that the peaks seen in FIGS. 3a, 3b and 4a, 4b depend on the poly-Si gate-definition etch and overetch. Further, the cyclic sweep used in this disclosure proves that the observed peaks are displacement currents due to the change in the sense of the peak with sweep direction, and are suited as indicators of device damage.

Figure 5A:
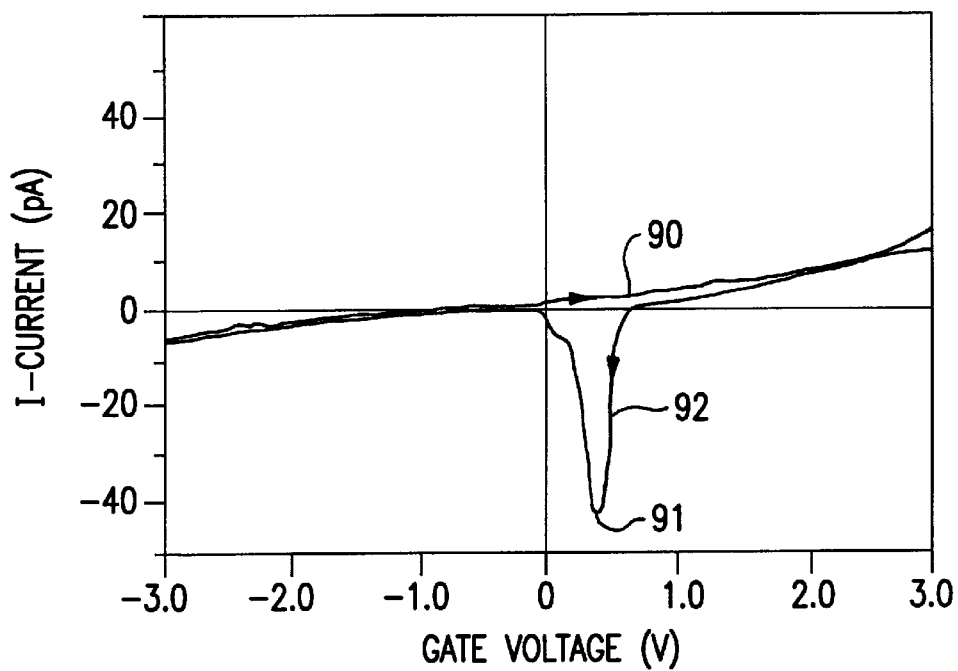
FIG. 5a shows a current-voltage sweep for a field device before annealing.
Figure 5B:
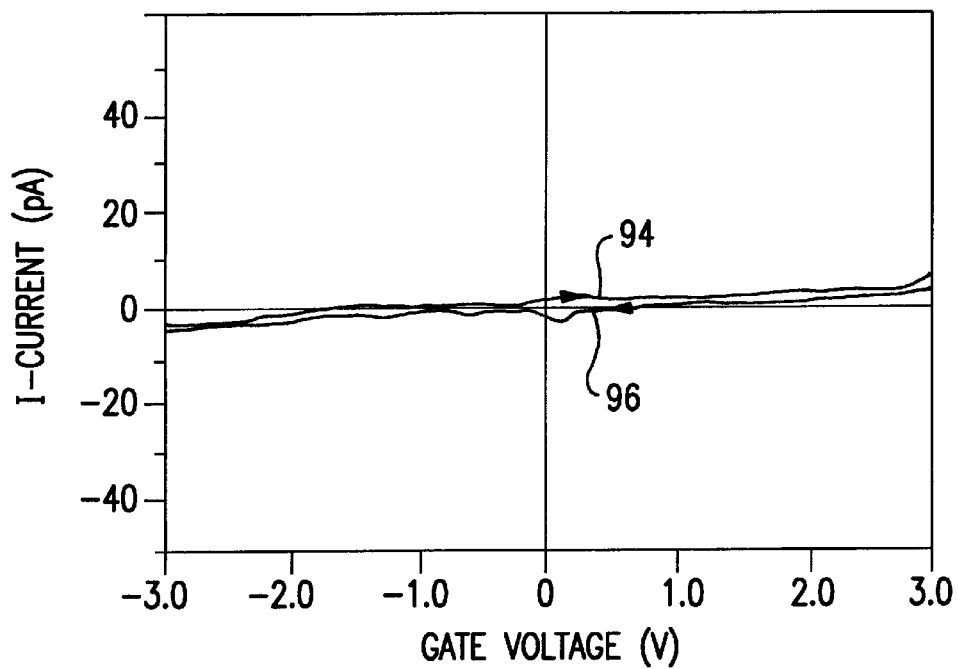
FIG. 5b shows a current-voltage sweep for a field device after annealing.
Figure 5C:
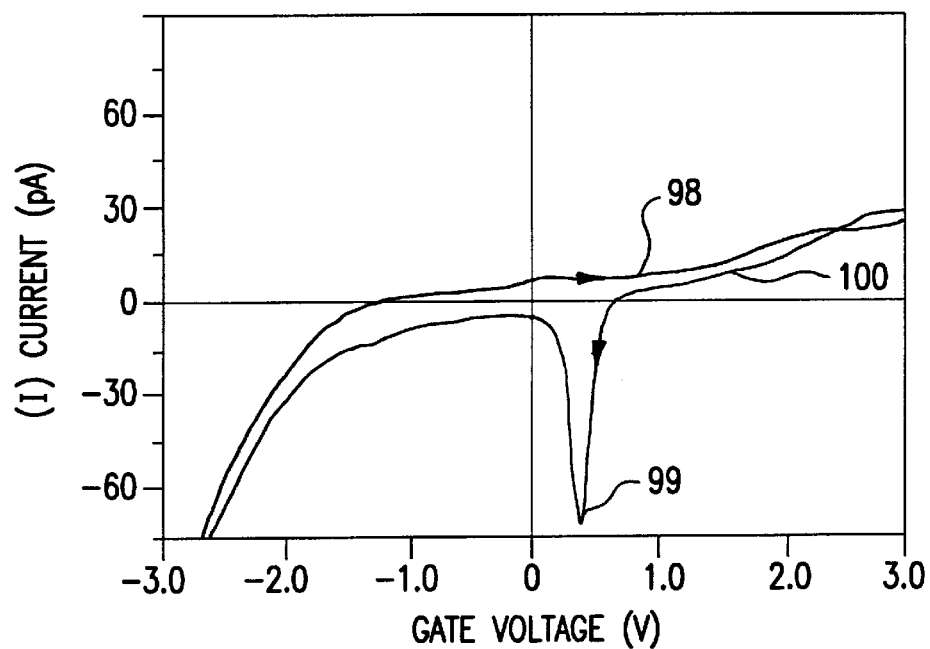
FIG. 5c shows a current-voltage sweep for a gate device before annealing.
Figure 5D:
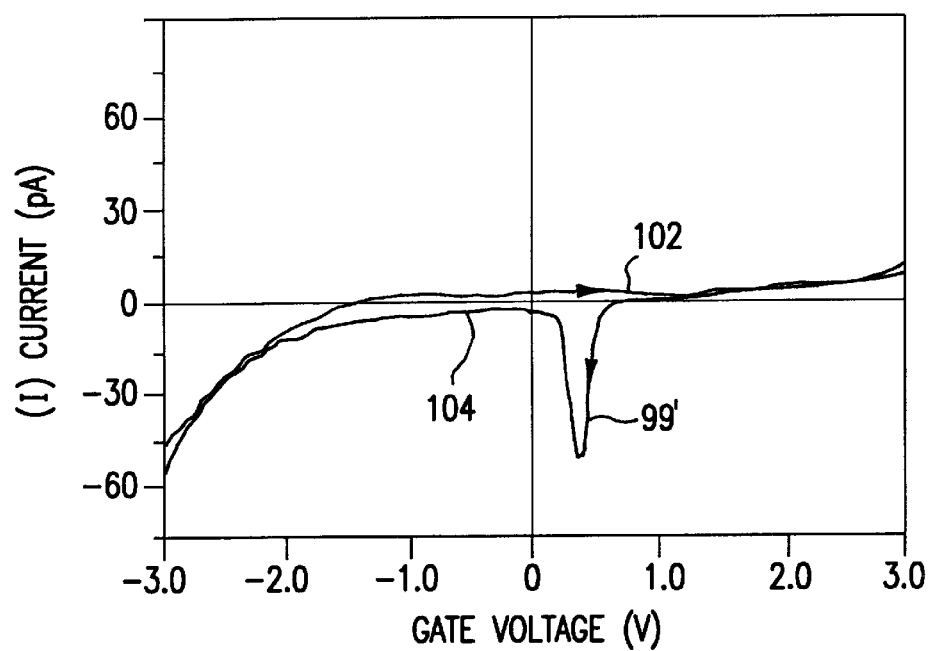
FIG. 5d shows a current-voltage sweep for a gate device after annealing.

FIGS. 5a and 5b show the effects of annealing on the charging current peaks seen for the field oxide device, and FIGS. 5c and 5d show the effects of annealing on the charging current peaks seen for the gate oxide device. More specifically, FIG. 5a shows curves 90 and 92 representing the forward and reverse sweeps, respectively, for the field oxide device with no annealing and FIG. 5b shows curves 94 and 96 representing the forward and reverse sweeps, respectively, after annealing at 400° C. for 30 min. forming gas anneal. The peak 91 present prior to annealing is seen to be essentially totally annealed out in FIG. 5b. FIG. 5c shows curves 98 and 100 representing the forward and reverse sweeps, respectively, for the gate oxide device with no annealing, and FIG. 5d shows curves 102 and 104 representing the forward and reverse sweeps, respectively, after annealing at 400° C. for 30 min. The peak 99 present prior to annealing is still present after annealing as peak 99' in FIG. 5d. This means that the annealing either reduces the generation and recombination lifetimes in the field oxide device, or it removes trapping sites giving rise to the peaks in the field oxide device, but did not remove traps in the gate oxide device. Thus the measurement has established that this etching process step has caused a different type of damage in the gate oxide device. This agrees with previously published results obtained by more difficult, three terminal measurements on the transistor structures. Monitoring of charging current structure is, therefore, an effective means of monitoring processing changes.

Response of I-V Sweep Charge Rearrangement

Figure 8:
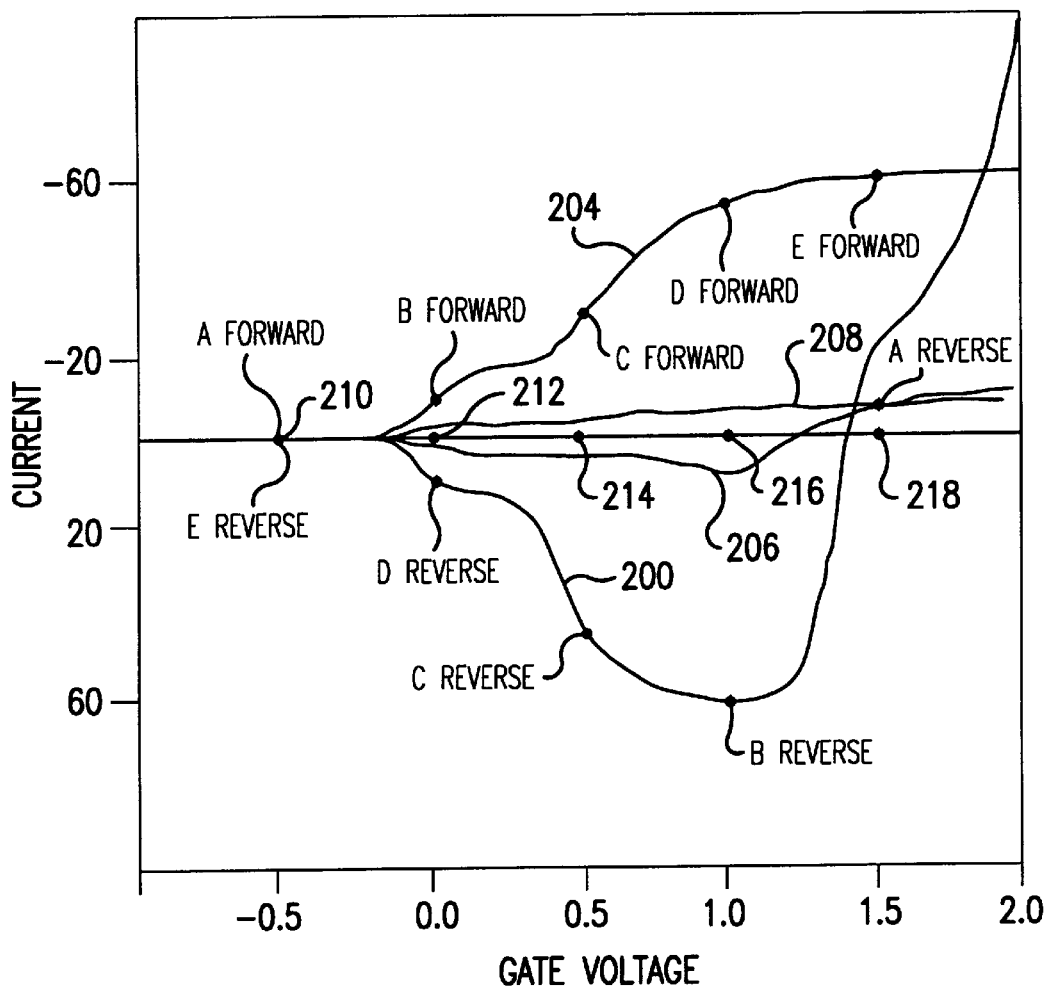
FIG. 8 is a plot of current response measured during a cyclic I-V sweep versus gate voltage, for stressed and unstressed devices, where the current and gate voltage axes have been reversed to give equivalent gate voltage and current magnitude if the substrate were grounded.
Figure 9A:
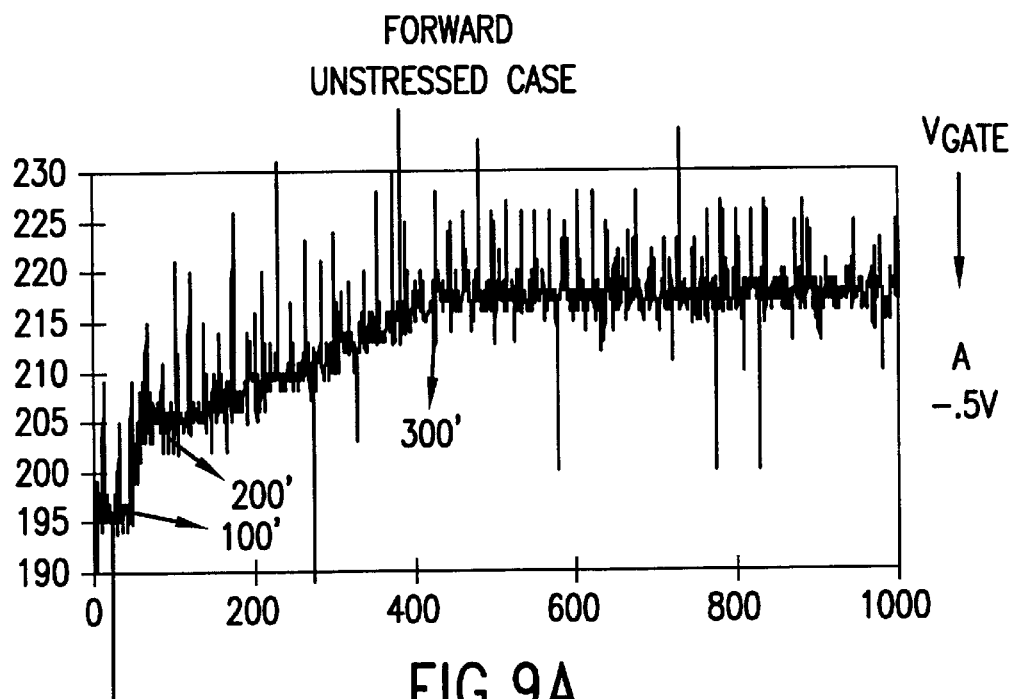
FIG. 9 shows forward sweep Q(t) responses before and after stressing at specific gate voltages.
Figure 9B:
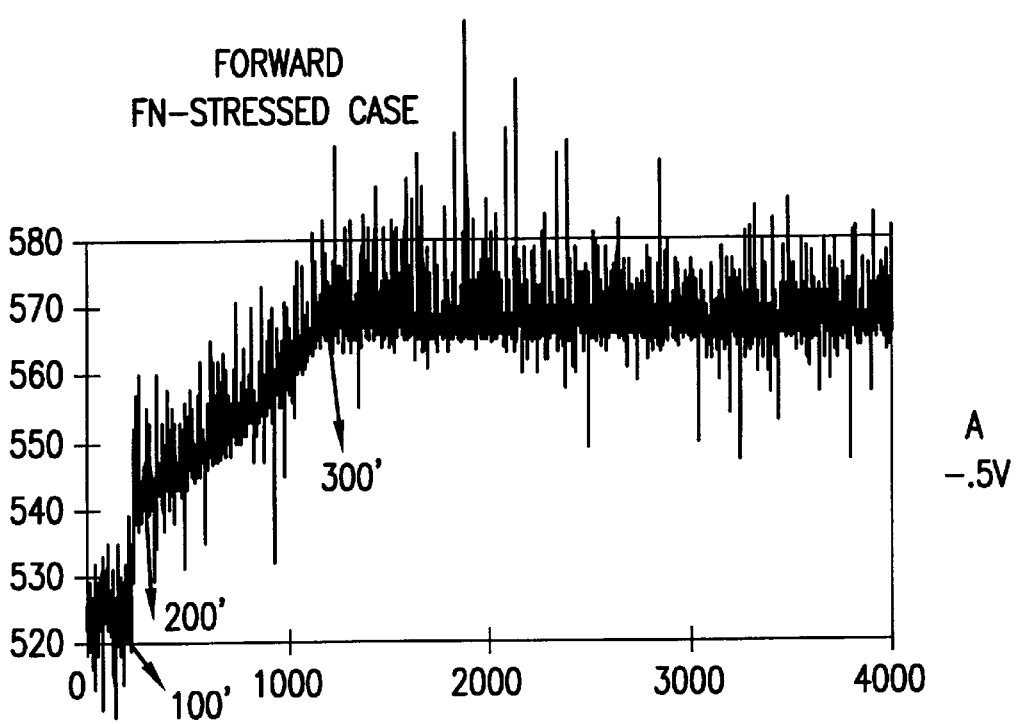
Figure 9C:
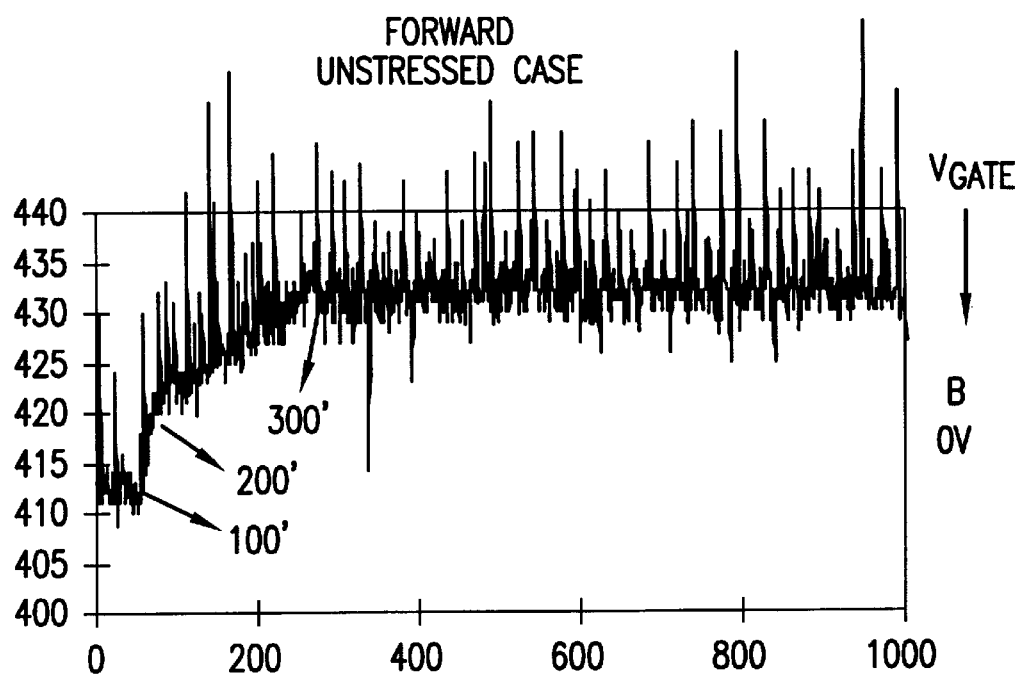
Figure 9D:
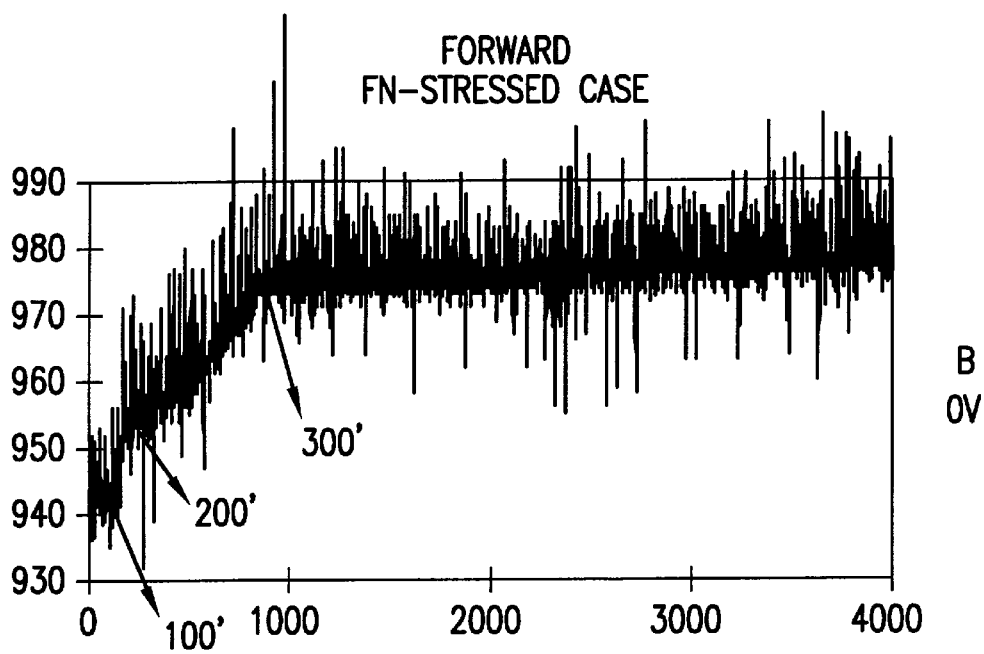
Figure 9E:
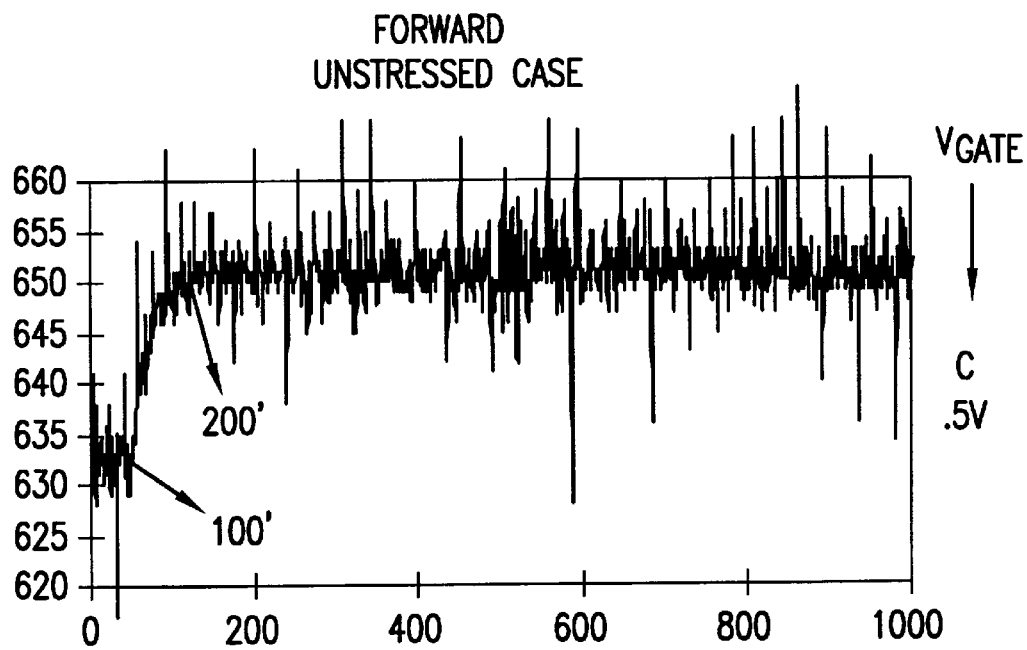
Figure 9F:
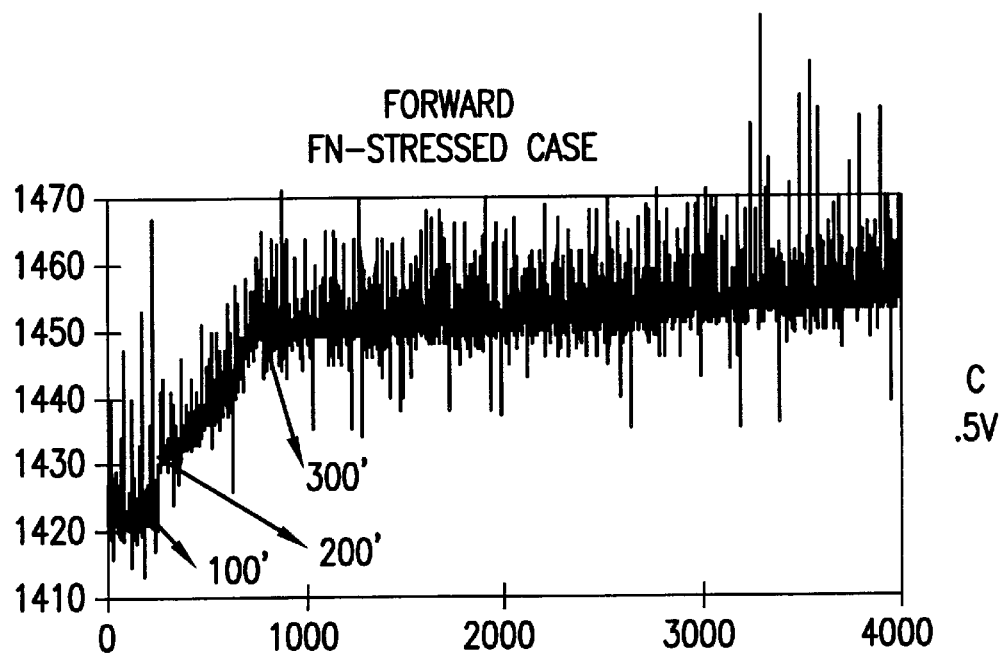
Figure 9G:
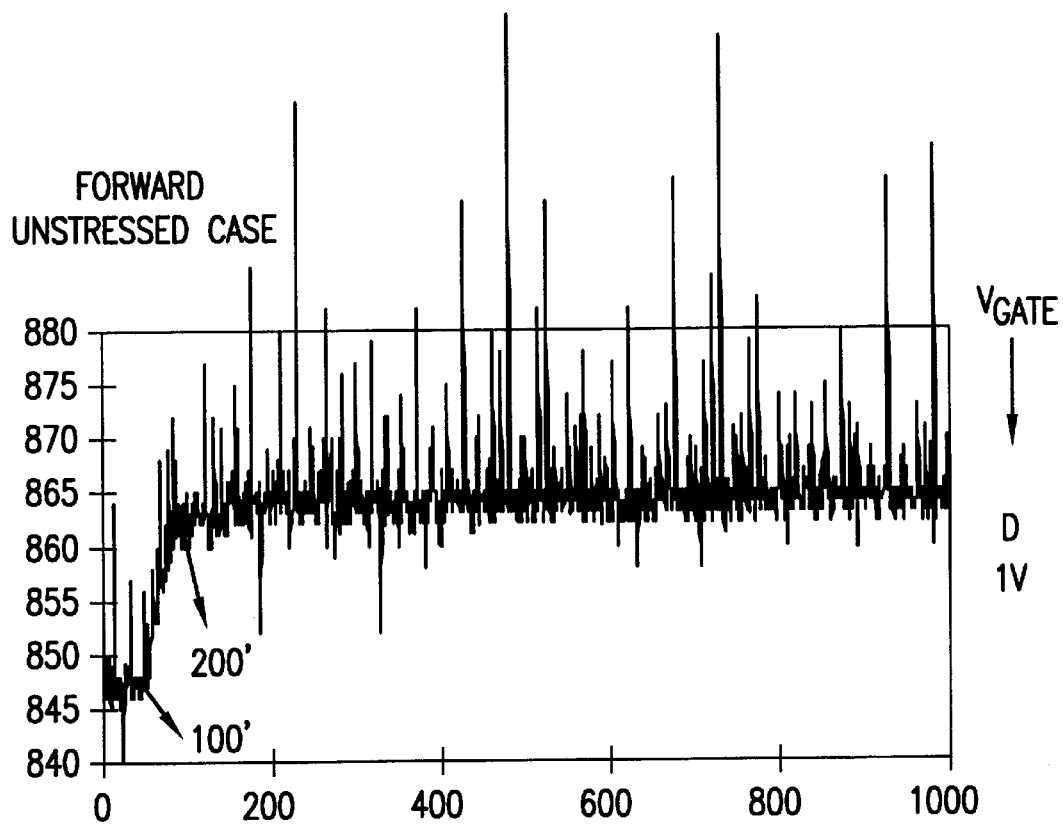
Figure 9H:
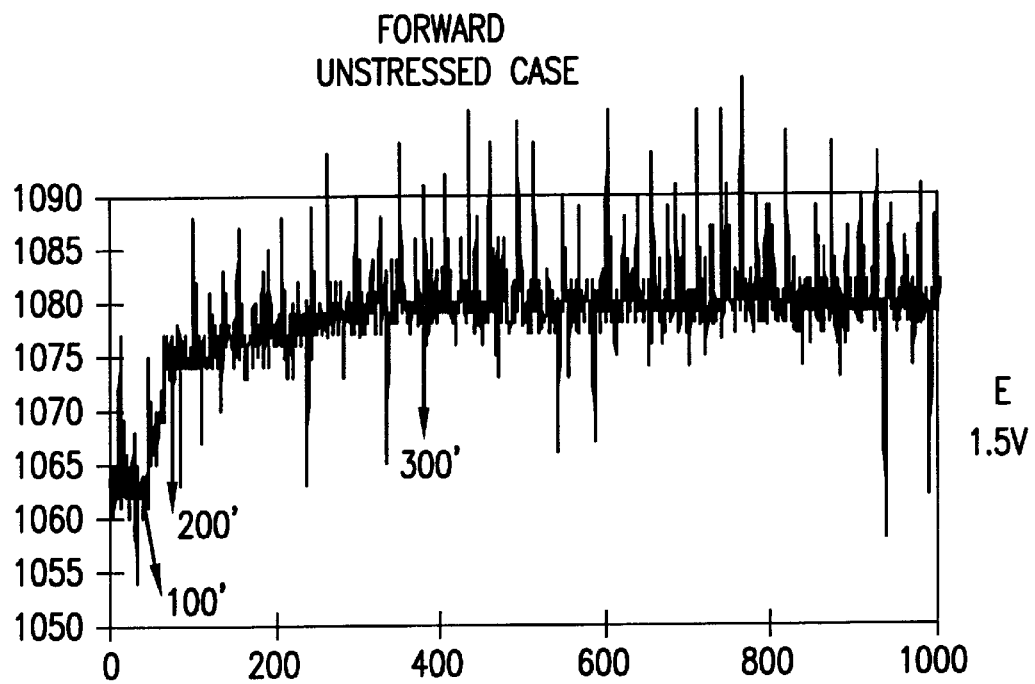
Figure 10A:
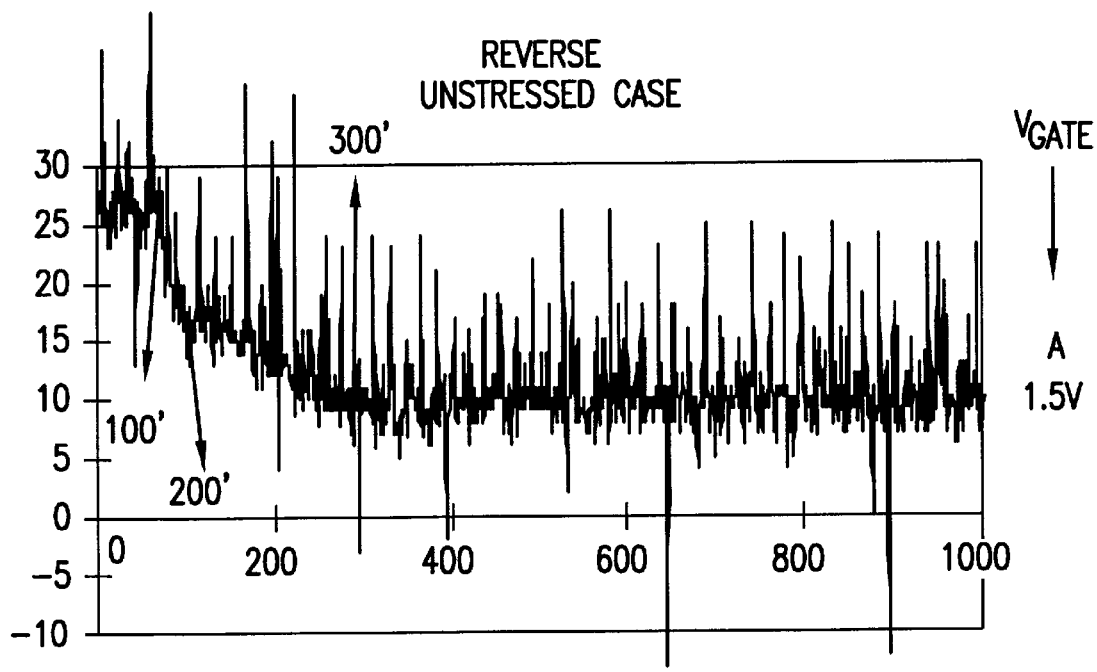
FIG. 10 shows reverse sweep Q(t) responses before and after stressing at specific gate voltages.
Figure 10B:
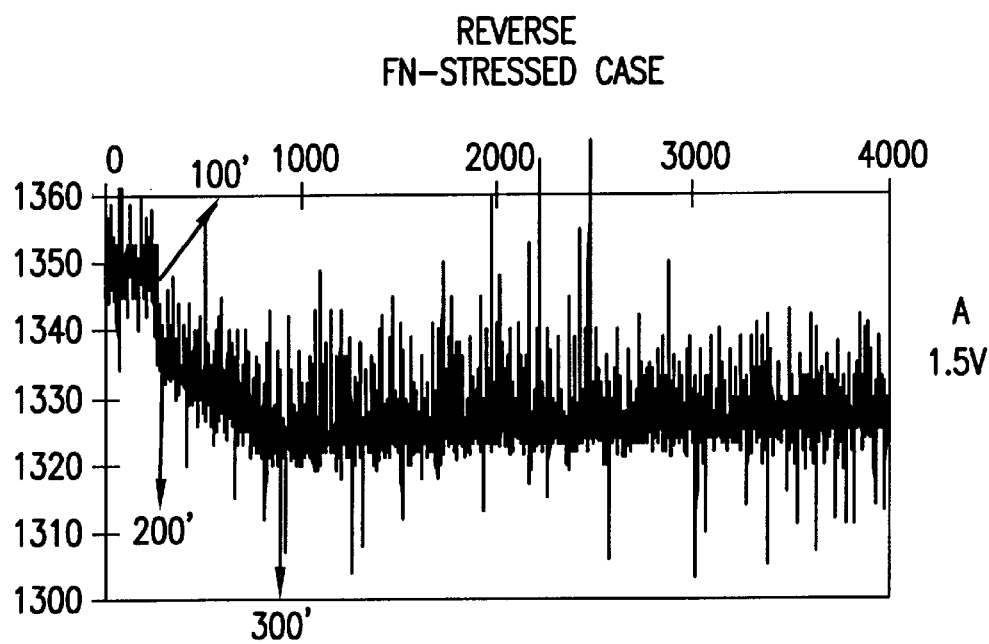
Figure 10C:
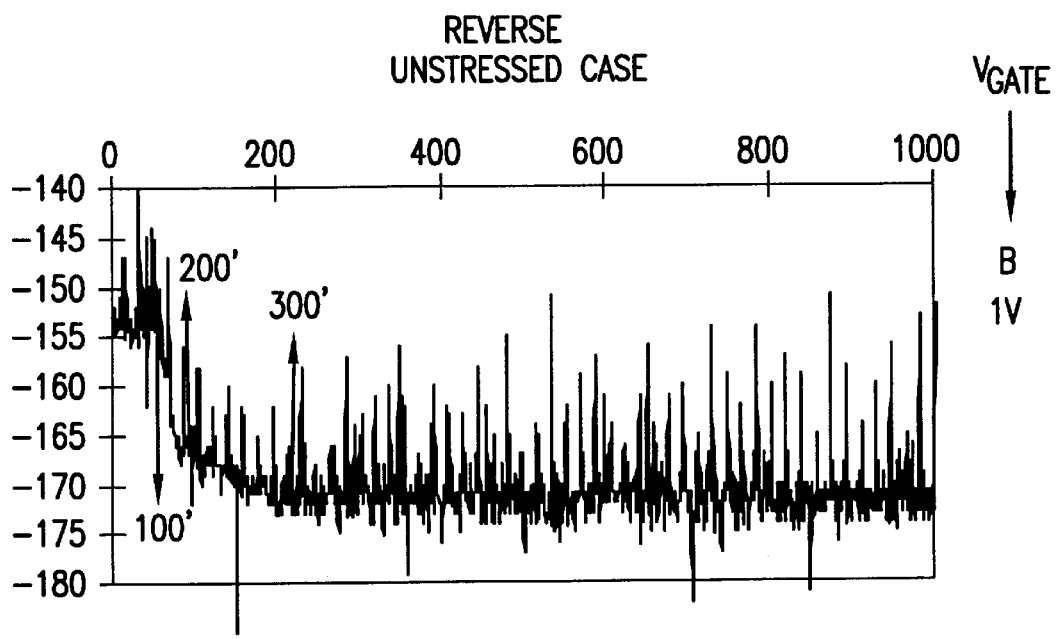
Figure 10D:
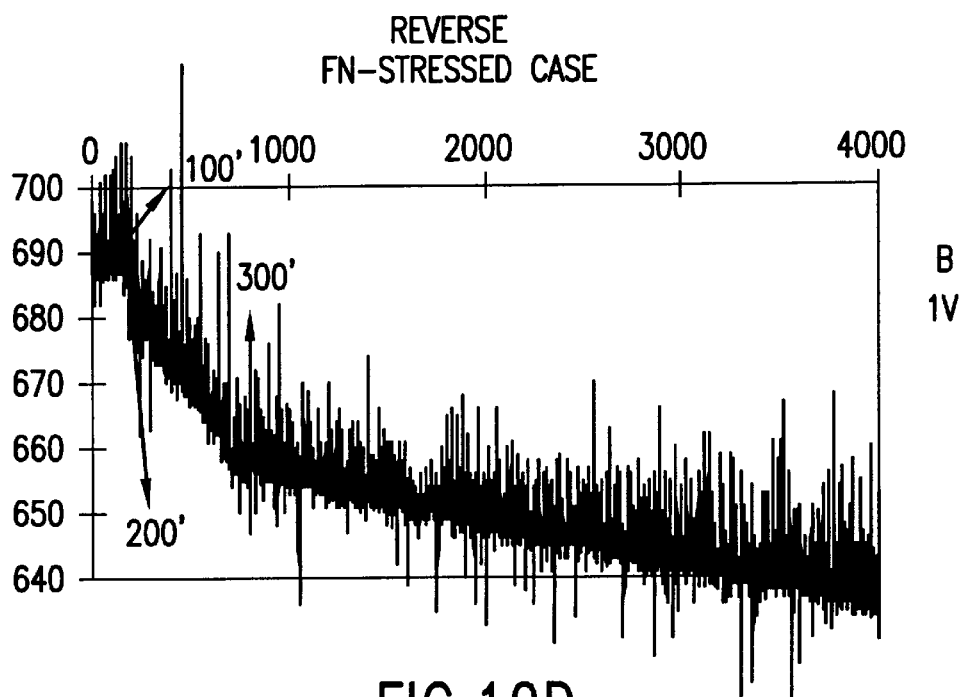
Figure 10E:
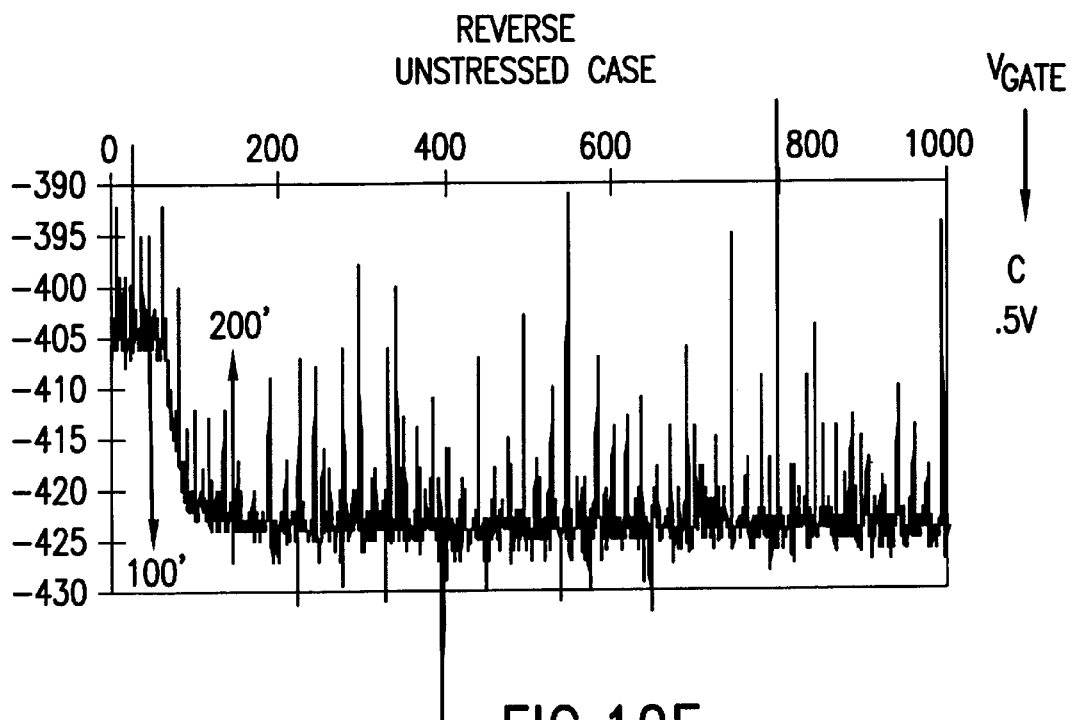
Figure 10F:
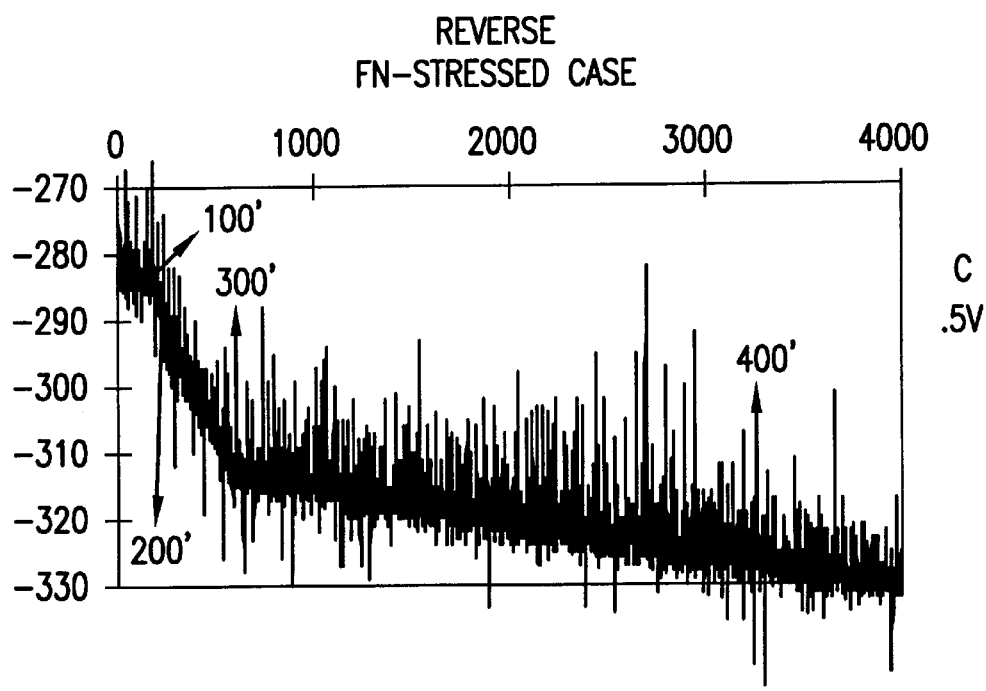
Figure 10G:
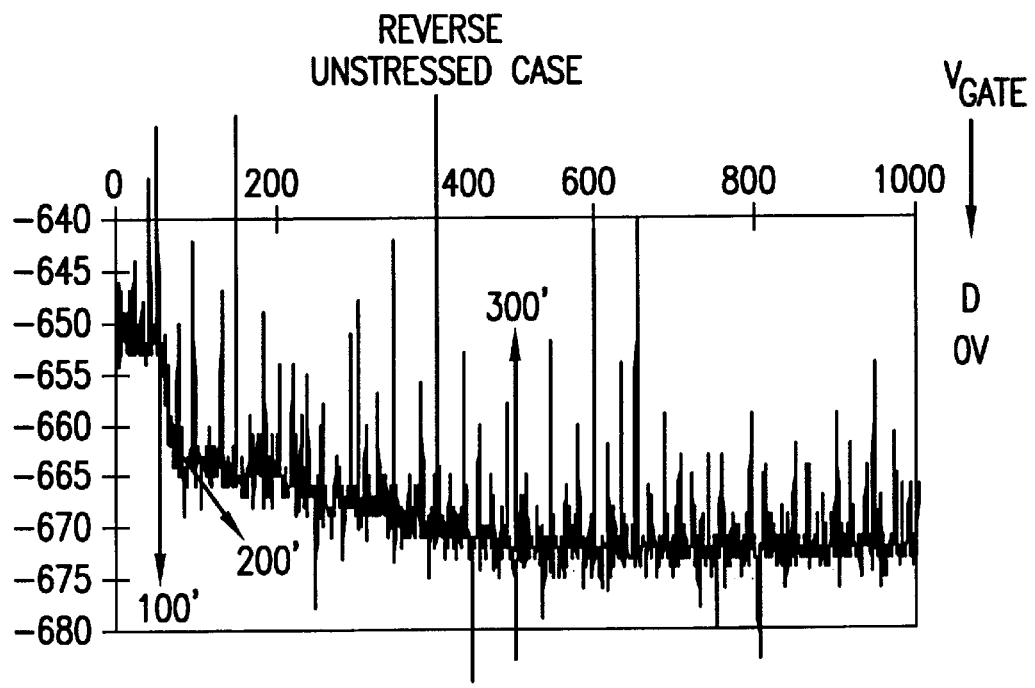
Figure 10H:
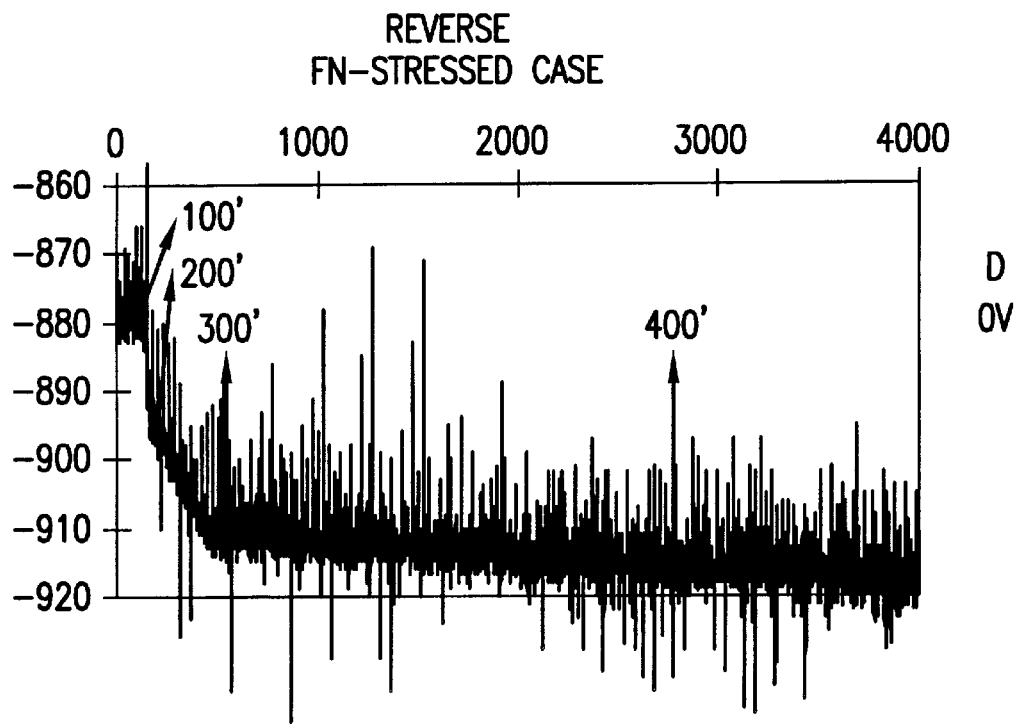
Figure 10I:
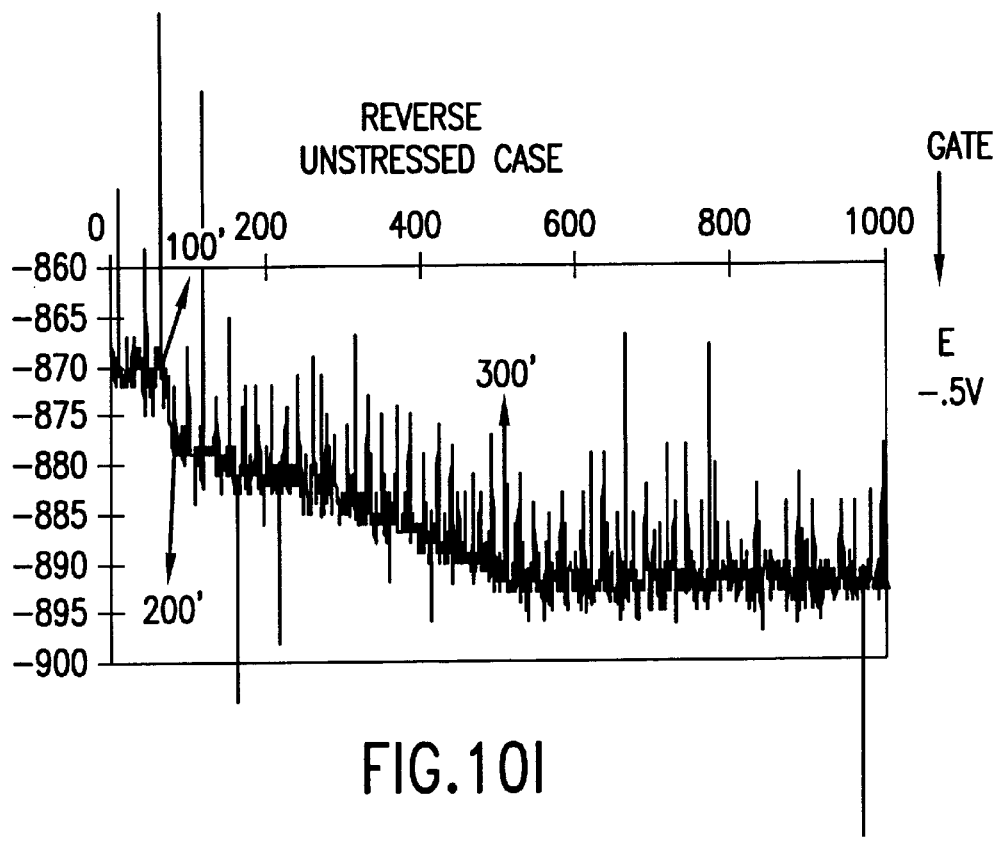
Figure 10J:
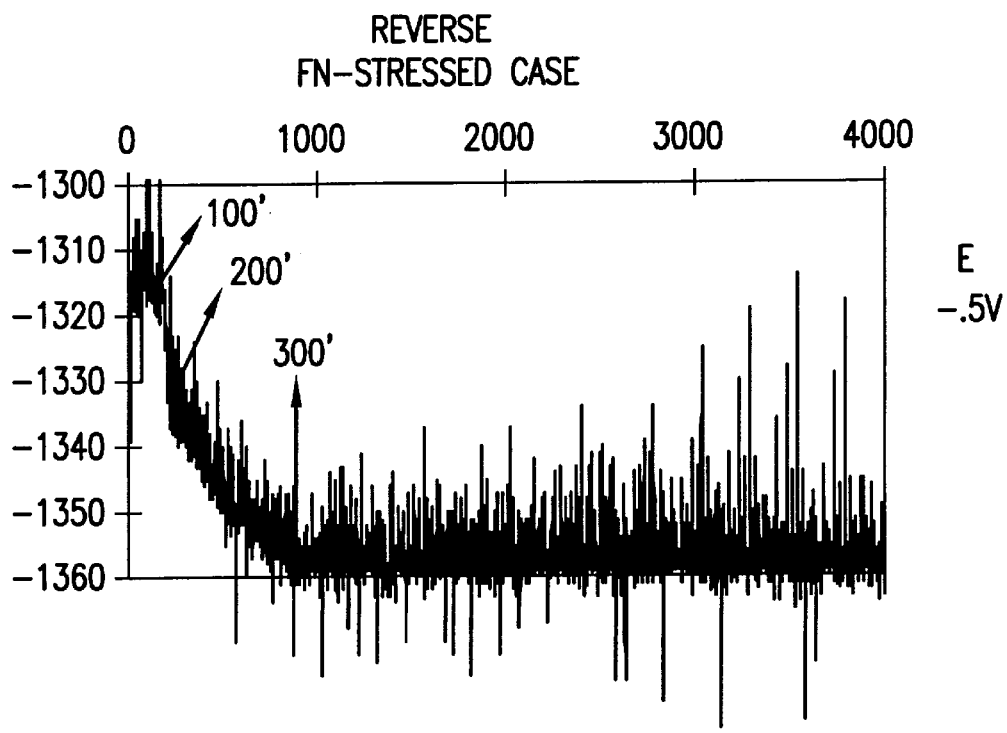

Attention is again directed to the device 13 shown in FIG. 1b. It is noted that when the device 13 has its voltage V at some point in a voltage sweep changed by $\Delta V$, the structure must rearrange its charge dipole to support the new voltage $V+\Delta V$. If one monitors the current flowing after some time $\Delta t_D$ after the step $\Delta V$ is applied but before the next step is applied, there will be, in general, current flowing due to dipole rearrangement going on as well as the previously discussed quasistatic tunneling current $I_{tun}$ that should flow for the voltage $V+\Delta V$. If $\Delta t_D$ is taken long enough then only $I_{tun}$ is seen. If one integrates the whole current flow after $\Delta V$ is applied out to some time $\Delta t_D$, the resultant charge $\Delta Q$ is the change in the dipole that has occurred out to time $\Delta t_D$ plus a small contribution from $I_{tun}$. FIG. 8 shows the general features of monitoring current using this method, where current (ordinate) is shown as a function of total gate voltage $(V+\Delta V)$. Curves 204 and 200 represent forward and reverse sweep data for an unstressed device, respectively, while the curves 208 and 206 represent forward and reverse sweep data for a stressed device, respectively. The parameter $\Delta t_D$ is 100 msec.

FIGS. 9 and 10 are plots of $\Delta Q(t)$ (ordinate) as a function of time t (abscissa), and show the general features seen in monitoring the evolution of ΔQ out to some time $\Delta t_D$ for each voltage in the cyclic I-V procedure. The corresponding gate voltages $V_{gate}=V$ at which each curve in FIGS. 3 and 4 were made are denoted to the left of each curve. As can be seen, the direction of the sweep does influence the current or ΔQ response, due to carrier trapping/detrapping and bulk generation and recombination. As can be seen also, damage causes clear changes in the observed response. All curves in FIGS. 8, 9, and 10 represent data for the same sample in its prestressed and damaged state.

Analysis of Observed Charging Current Structure

The effects of FN stressing on the charging current structure has been investigated using devices that have been exposed to plasma processing. Charging current structure has been found that stressing done before annealing affects these field oxides, and gate oxide charging/discharging current peaks differently.

Figure 6A:
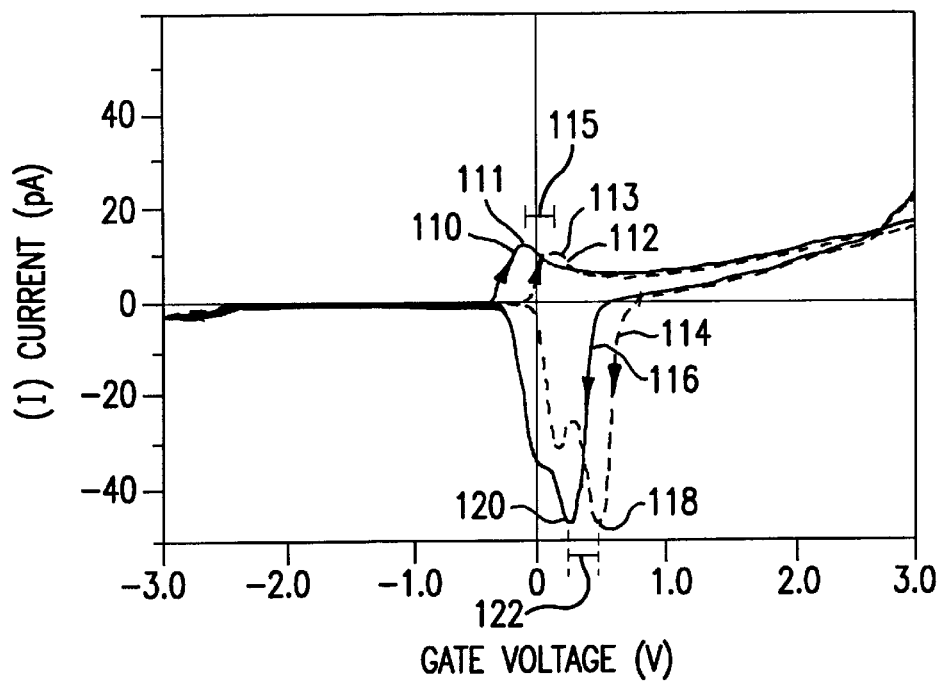
FIG. 6a shows a current-voltage sweep for an unannealed field oxide device before and after a negative gate Fowler-Nordheim stress.

Attention is first directed to FIG. 6a which illustrates voltage sweeps of a field oxide device before and after stressing. More specifically, curves 112 and 114 show forward and reverse sweeps, respectively, before stressing, and curves 110 and 116 represent forward and reverse sweeps, respectively, after stressing. Peaks 111 and 113 represent charging current peaks before and after stressing, respectively, for the forward sweeps. Peaks 118 and 120 represent charging current peaks before and after stressing, respectively, for reverse voltage sweeps. For the FN stressing used (10 μA for 20 seconds) both positive gate and negative gate stressing of the field oxide devices caused very little growth in the amplitudes of the charging current peaks 111, 113, 118 and 120; however, the peaks tended to shift by amounts 115 and 122 (for forward and reverse sweeps) in the negative voltage direction. This is very pronounced for the negative FN stress as seen in FIG. 6a. The shift in these peaks for negative FN stress is consistent with the flatband voltage shifts expected from studies of other workers using other techniques. Hence, the negative stress is putting positive charge in the oxide, and the peak shifts can be attributed to a corresponding band shift at the interface for these field oxide devices.

Figure 6B:
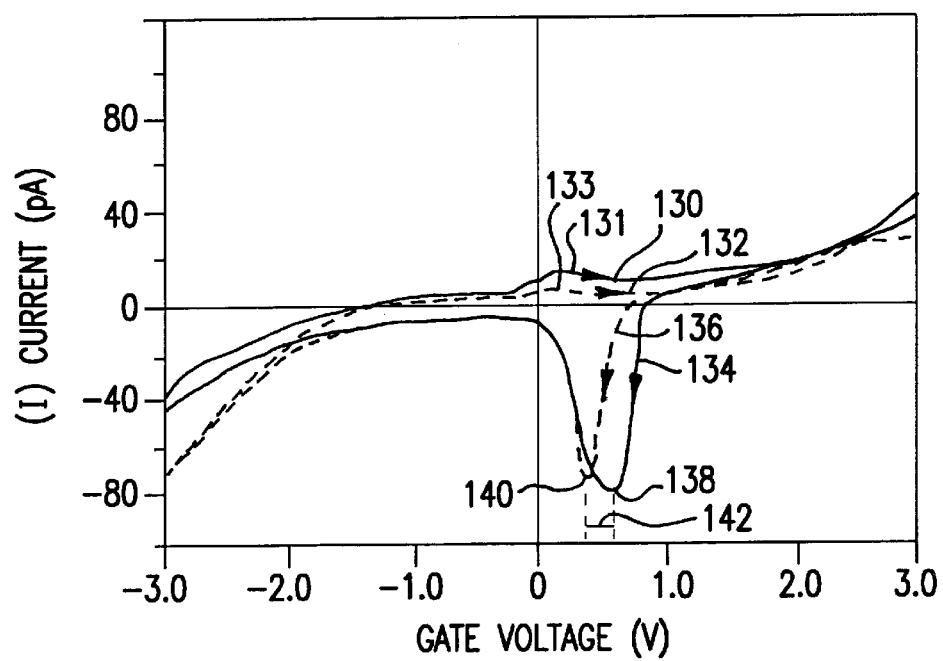
FIG. 6b shows a current-voltage sweep for an unannealed gate oxide device before and after a negative gate Fowler-Nordheim stress.

Attention is next directed to FIG. 6b which illustrates voltage sweeps of a gate oxide device before and after stressing. More specifically, curves 132 and 136 show forward and reverse sweeps, respectively, before stressing, and curves 130 and 134 represent forward and reverse sweeps, respectively, after stressing. Peaks 133 and 131 represent charging current peaks before and after stressing, respectively, for the forward sweeps. Peaks 140 and 138 represent charging current peaks before and after stressing, respectively, for reverse voltage sweeps. In the case of the gate oxide device, the peak heights and widths, in general, increase after both positive or negative FN stress. As seen in FIG. 6b for the particular case of a negative FN stress, the amplitudes of the peaks always enlarge and shift an amount 142 toward positive voltages after stressing of the gate oxide devices. It must be noted that this occurred even through C-V data (see FIG. 4c) again showed that these same FN stresses were causing flatband voltage shifts in the negative voltage (i.e., positive charge) direction.

The observed position of the displacement current peaks yields insight into the performance of both field and gate devices.

Analysis of Observed Charge Rearrangement

Attention is now directed to the cyclic ΔQ response and its use in monitoring damage. To obtain ΔQ, a sensitive electrometer circuit was fabricated where the voltage output is proportional to the collected charge as a function of time, ΔQ(t). More information on this circuit 163 is presented in the subsequent discussion of the apparatus shown in FIG. 7. This output is then digitized using a high speed analog to digital (A/D) converter card for further analysis. The damage seen in the ΔQ(t) versus time t plots of FIGS. 8, 9 and 10 is simulated charging damage caused by FN stress (−0.1 nA/μm² for 30 sec). The forward and reverse sweep data in FIGS. 9 and 10 show substantial differences in the magnitude of the charge changes. Specific comments concerning these differences will be addressed in the following section.

DISCUSSION OF MEASURED DATA

I-V Sweep Charging Current

As noted earlier in this disclosure, the charging current structure seen in the I-V cyclic sweeps of FIGS. 3a, 3b and 4a, 4b must be due to minority carrier electrons (for the p-type silicon used) flowing in and out of the inversion layer, holes and electrons being trapped and detrapped at or near the $SiO_2$/substrate Si interface or in the silicon, or both. By using this cyclic I-V sweep approach, these charging currents can be separated from the background tunneling currents.

To summarize the analysis of the measured data, it is apparent that the cyclic I-V sweep method can be used to monitor processing changes using simple two terminal structure of the form poly-Si/ultra-thin $SiO_2$/substrate Si capacitor structures. As shown with the specific example of plasma processing damage, measured parameters, which have been discussed previously, are used to determine properties of charging current structure formed in the forward and reverse sweeps of voltage. These charging current properties include the amplitude in current, the width in voltage and position with respect to applied voltage. The methodology has been specifically shown as an effective means for identifying damage that has been introduced into the oxide of a device when it is exposed to a plasma.

I-V Sweep Charge Arrangement

It is first noted that if all of the 50 mV steps for ΔV used in the sweeps depicted in FIGS. 8, 9 and 10 were developed across the device oxide, then ΔQ would be 2.45 pC. This is 10 units on the ordinates of FIGS. 9 and 10. First examining the curves of FIG. 9 at gate voltage "A", which is the forward sweep progressing through the accumulation, it can be seen that 2.45 pC is developed in the time between points denoted 100' and 200' for both the pre-stressed and damaged state. The increasing ΔQ between times 200' and 300' in FIG. 9 for voltage "A" implies holes are tunneling out from oxide states at energies approximately at the Si valence band edge inside the oxide. This contribution to ΔQ is seen to be much larger, and to have a longer time constant, for the damaged state. At gate voltage "C" of the forward sweep, the Fermi level is moving up through the interface states in the bottom part of the Si energy gap. Differences in the detrapping due to damage are apparent at gate voltage C. By the time gate voltage "E" is reached in the forward sweep, it can be seen that depletion has been reached, and the ΔQ(t) activity must still be due to detrapping at or near the interface.

For the reverse sweep data shown in FIG. 10, it is noted that the inversion layer can be present. At gate voltage A of the reverse sweep, the negative charge clearly seen between time points 100' and 200' implies that the inversion layer is changing at gate voltage A of the reverse sweep. At gate voltage B, the reverse sweep Fermi level is moving through the interface states in the top of the Si energy band gap. Hence electron emission to the Si conduction band is seen. Two such processes are present for the damage case. One (time points 300' and 400') has a very long time constant of the order of 100 msec. These times are controlled by any tunneling time required to get from within the oxide and the Boltzman factor for emission to the conduction band. By the time gate voltage F is reached, it is the mirror image of gate voltage A in the forward sweep (See FIG. 9) as would be expected. The localized state response is the same at gate voltage A of the forward sweep and at gate voltage E of the reverse sweep since tunneling is controlling the localized state response at these steps.

Figure 11:
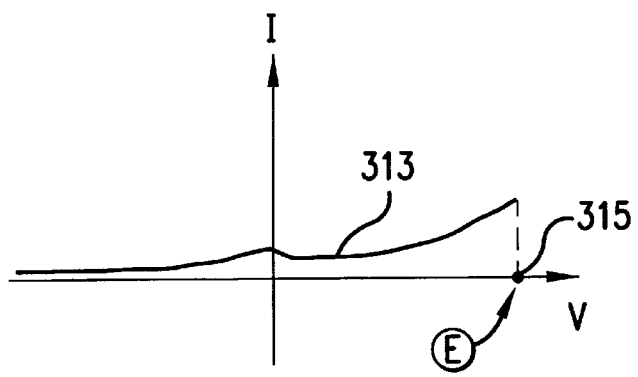
FIG. 11 shows a forward current-voltage sweep wherein the structure is exposed to a pulse of light prior to initiating a reverse voltage sweep.

Attention is directed to FIG. 11 which illustrates current I (ordinate) versus voltage V (abscissa) curve 313 for a forward voltage sweep. At some voltage E, identified by the numeral 315, the device is exposed to a pulse of preferably white light, although light with narrow bandwidths can be used. After exposure to the light pulse "flash", a reverse sweep in started. The light pulse creates minority carriers to form a full inversion layer. Differences between full (i.e., with the light flash or by waiting for a long period of time) and partial (i.e. by starting immediately the reverse voltage sweep) inversion layer formation will provide further information on the physical properties of the Si/SiO$_2$ system.

It has been observed that current-voltage response of structures exposed to both forward and forward and reverse sweeps is sensitive to absorbed species. More particularly, it has been observed that these structures are sensitive to water vapor, and that observed current-voltage responses are very sensitive functions of the humidity conditions to which the structure is exposed. The invention can, therefore, be further exploited to create high sensitivity gas and chemical sensors using these devices and the measuring techniques set forth in this disclosure.

The following section discloses apparatus for measuring the quantities of interest, and for performing the analysis of these measured quantities in order to obtain the parameters of interest for the device being tested.

APPARATUS

Figure 7:
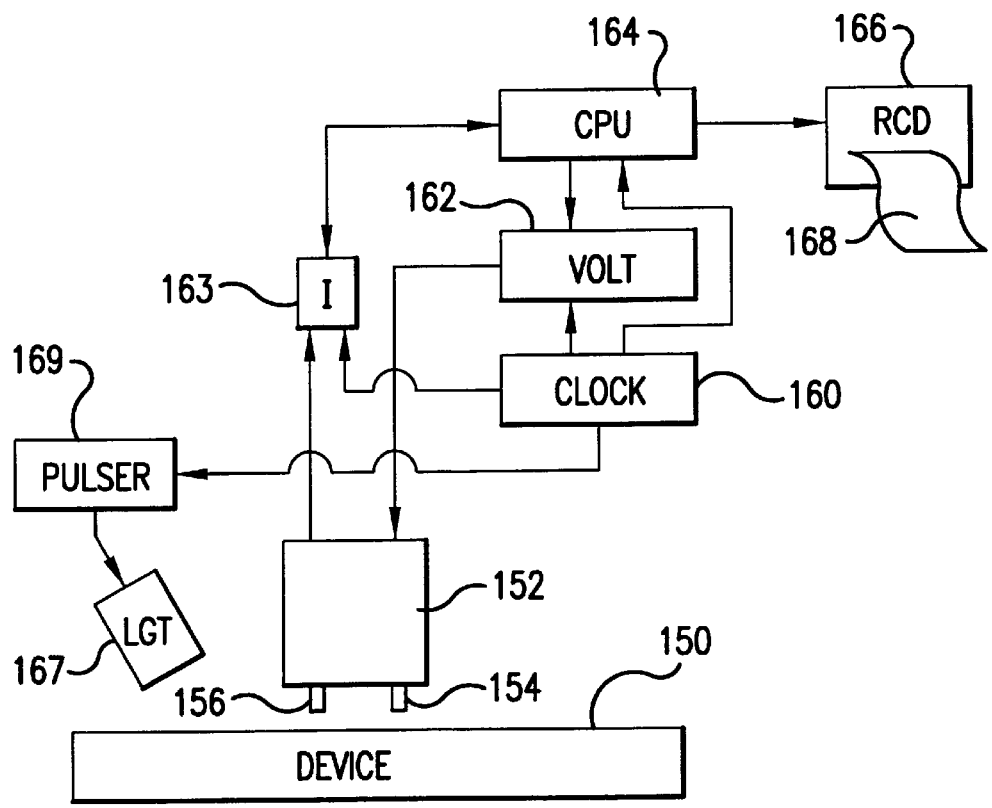
FIG. 7 shows a functional diagram of the apparatus of the invention.

The apparatus used to perform the cyclic I-V measurements, and further used to analyze the measured data, is shown in FIG. 7. The device to be tested is identified by the numeral 150. A probe 152 comprising two terminals 154 and 156 is used to apply cyclic forward and reverse voltage sweeps to the device as discussed previously, and to sense currents induced within the device 150 resulting from the voltage sweeps. The induced currents are quantified with a current measuring device 163, such as an high sensitivity ammeter or a sensitive electrometer circuit whose voltage output is proportional to current collected. The probe 152 can directly contact the device 150, or can be brought in close proximity to the device so that it is capacitatively coupled to the device as mentioned previously.

Voltage is supplied to the probe 152, and subsequently to the device 150, by means of a voltage supply 162 A clock 160 cooperates with the voltage supply 162 to provide the incremental voltage increases or decreases, ΔV, required in the cyclic I-V sweep, over the time interval Δt. The magnitudes of the incremental voltage ΔV and the time increment Δt are preferably selected and preprogrammed into a central processing unit (CPU) 164 which controls the output of the voltage supply 162, over the time interval Δt, in cooperation with the clock 160. The time increments $\Delta t_D$ between voltage incrementation, and the times $t_1$ and $t_2$, are also preferably preprogrammed into the CPU 164 which implements these voltage implementations in cooperation with the clock 160, and also implements the current measurements in cooperation with the current measuring device 163. Maximum and minimum voltage levels which define the voltage sweep range are also preferably preprogrammed within the CPU 164.

Current I generated within the device 150 as a result of the applied voltages is picked up by the probe 152, quantified by the device 163, and input into the CPU 164 as a function of gate voltage V. As discussed in detail, current as a function of gate voltage exhibits charging current structure whose amplitude, width, and position with respect to V, contains information pertaining to the desired damage state and operating condition of the device 150. This information is determined with the CPU 164 using algorithms of methodology discussed previously. Results of the I-V data analysis are output to a suitable recording device 166 and presented as a suitable record 168 such as a hard copy tabular listing, a digital recording, or any other type of suitable output.

A preferably white light source 167 is optionally used to expose the device 150 to a pulse of light between forward and reverse voltage sweeps as discussed previously and illustrated in FIG. 11. The pulse parameters light source 167 is controlled by a pulser 169 which is supplied specific timing parameters through cooperation with the clock 160.

The device 163 is preferably a charge amplifier electrometer circuit comprising an operational amplifier and variable capacitance such that feedback can be controlled. Charge to voltage conversion is given by $$V_o = (-1/C_{int}) \int I_{in}(t)dt = (-1/C_{int})Q(t) \qquad (2)$$

where $V_o$ in the potential, $I_{in}(t)$ is the instantaneous current at time t, $C_{int}$, is the effective capacitance of the electrometer, and Q(t) is the collected charge as discussed in a previous section of this disclosure.

The disclosed methods and apparatus meet all of the stated objects of the invention. While the foregoing disclosure is directed to the preferred embodiments of the invention, the scope thereof is determined by the claims which follow.

What is claimed is:

1. A method for measuring properties of a microelectronic device, comprising the steps of:
   (a) applying a voltage to said device;
   (b) changing said voltage in predetermined increments, with predetermined time intervals between incremental changes in said voltage, until a first limit voltage is reached;
   (c) measuring during said time intervals current induced within said device as a function of voltage;
   (d) determining said properties from one or more charging current peak structures occurring in said current measurements; and
   (e) determining density of defects within said device from a magnitude of said one or more charging current peak structures.

2. The method of step 1 including the additional steps of:
   (a) once said first limit voltage level is reached, holding said first limiting voltage for a prescribed period of time;
   (b) reversing the sense of said voltage incrementations;
   (c) incrementally changing said voltage in said reversed sense, with said predetermined time intervals between said incremental changes, until a second limit voltage is reached; and
   (d) measuring during said time intervals current induced within said device.

3. The method of claim 2 wherein said voltage is first incremented in a positive sense.

4. The method of claim 3 wherein the magnitudes of said incremental changes of voltage are equal.

5. The method of claim 3 wherein said predetermined time intervals are equal.

6. The method of claim 3 wherein said first and said second limit voltage levels are related to microelectronic device operating voltage limits and are equal in magnitude and opposite in algebraic sign.

7. The method of claim 1 further comprising the step of determining additional charge within the device from the position of said charging current peak structures with respect to said applied voltage.

8. The method of claim 1 wherein changes in said charging current peak structure are used to monitor processing and processing equipment.

9. The method of claim 1 wherein said voltage incrementation time intervals are equal and said predetermined time intervals are equal.

10. A method for measuring properties of a microelectronic device, comprising the steps of:
   (a) applying a voltage to said device;
   (b) changing said voltage in predetermined increments, with predetermined time intervals between incremental changes in said voltage, until a first limit voltage is reached;
   (c) measuring during said time intervals current induced within said device as a function of voltage;
   (d) determining said properties from one or more charging current peak structures occurring in said current measurements; and
   (e) using changes in said charging current peak structures to monitor processing and processing equipment.

11. The method of step 10 including the additional steps of:
   (a) once said first limit voltage level is reached, holding said first limiting voltage for a prescribed period of time;
   (b) reversing the sense of said voltage incrementations;
   (c) incrementally changing said voltage in said reversed sense, with said predetermined time intervals between said incremental changes, until a second limit voltage is reached; and
   (d) measuring during said time intervals current induced within said device.

12. The method of claim 11 wherein said voltage is first incremented in a positive sense.

13. The method of claim 12 wherein the magnitudes of said incremental changes of voltage are equal.

14. The method of claim 12 wherein said predetermined time intervals are equal.

15. The method of claim 12 wherein said first and said second limit voltage levels are related to microelectronic device operating voltage limits and are equal in magnitude and opposite in algebraic sign.

16. The method of claim 12 further comprising the step of determining additional charge within the device from the position of said charging current features with respect to said applied voltage.

17. The method of claim 10 wherein said voltage incrementation time intervals are equal and said predetermined time intervals are equal.

18. A method for measuring properties of a microelectronic device, comprising the steps of:
   (a) applying a voltage to said device;
   (b) changing said voltage, with predetermined time intervals between changes in said voltage, until a first limit voltage is reached;
   (c) measuring during said time intervals current induced within said device as a function of voltage;
   (d) determining said properties from one or more charging current peak structures occurring in said current measurements;
   (e) determining density of defects within said device from a magnitude of said one or more charging current peak structures; and
   (f) using changes in said charging current peak structures to monitor processing and processing equipment.

19. The method of claim 18 including the additional steps of:
   (a) once said first limit voltage level is reached, holding said first limiting voltage for a prescribed period of time;
   (b) reversing the sense of said applied voltage;
   (c) changing said voltage in said reversed sense, with said predetermined time intervals between said changes, until a second limit voltage is reached; and
   (d) measuring during said time intervals current induced within said device.

20. The method of claim 19 wherein the magnitudes of said changes of voltage are equal.

* * * * *